US012660521B2

(12) United States Patent
Lin et al.

(10) Patent No.: US 12,660,521 B2
(45) Date of Patent: Jun. 16, 2026

(54) SEMICONDUCTOR STRUCTURE AND MANUFACTURING METHOD THEREOF

(71) Applicants: TAIWAN SEMICONDUCTOR MANUFACTURING COMPANY, LTD., Hsinchu (TW); National Yang Ming Chiao Tung University, Hsinchu City (TW)

(72) Inventors: Chun-Liang Lin, Hsinchu City (TW); Chenming Hu, Oakland, CA (US); Wan-Hsin Chen, Hsinchu City (TW); Naoya Kawakami, Hsinchu City (TW)

(73) Assignees: TAIWAN SEMICONDUCTOR MANUFACTURING COMPANY, LTD., Hsinchu (TW); NATIONAL YANG MING CHIAO TUNG UNIVERSITY, Hsinchu City (TW)

( * ) Notice: Subject to any disclaimer, the term of this patent is extended or adjusted under 35 U.S.C. 154(b) by 491 days.

(21) Appl. No.: 18/193,041

(22) Filed: Mar. 30, 2023

(65) Prior Publication Data

US 2024/0332013 A1     Oct. 3, 2024

(51) Int. Cl.
*H10P 14/20*       (2026.01)
*H10P 14/24*       (2026.01)
(52) U.S. Cl.
CPC .......... *H10P 14/3436* (2026.01); *H10P 14/24* (2026.01); *H10P 14/2903* (2026.01); *H10P 14/3822* (2026.01)
(58) Field of Classification Search
CPC ......... H01L 21/02568; H01L 21/02376; H01L 21/0262; H01L 21/02694; H01L 21/0259;

H01L 21/02667; H01L 21/0244; H01L 21/02381; H01L 21/02433; H10D 30/481; H10D 99/00; H10D 30/48; H10P 14/3436; H10P 14/24; H10P 14/2903; H10P 14/3822; H10P 14/2905; H10P 14/3206; H10P 14/2926; H10P 14/3452; H10P 14/3802
See application file for complete search history.

(56) References Cited

U.S. PATENT DOCUMENTS

| | | | | |
|---|---|---|---|---|
| 6,372,681 | B1 * | 4/2002 | Yamada .................. | C08F 10/00 502/103 |
| 8,637,864 | B2 * | 1/2014 | Saito ................... | H10D 30/6729 257/E29.296 |
| 9,576,950 | B1 * | 2/2017 | Yeo ........................ | H10D 1/474 |

(Continued)

OTHER PUBLICATIONS

Duan et al., "The self-repairing of ion irradiation damaged Mo—S—Ti (MoST) lubricant films by thermal annealing", Journal of Physics D: Applied Physics, 2020, vol. 53, 155202, total 13 pages.

(Continued)

*Primary Examiner* — Dale E Page
*Assistant Examiner* — Quovaunda Jefferson
(74) *Attorney, Agent, or Firm* — Birch, Stewart, Kolasch & Birch, LLP

(57)     ABSTRACT

The present disclosure in various embodiments provides a method. In some embodiments of the present disclosure, the method includes forming a transition metal dichalcogenide layer on a substrate; and performing an ion bombardment process on the transition metal dichalcogenide layer, performing an annealing process on the transition metal dichalcogenide layer.

20 Claims, 21 Drawing Sheets

B-B'

(56) References Cited

U.S. PATENT DOCUMENTS

| | | | | |
|---|---|---|---|---|
| 9,975,777 | B2 * | 5/2018 | Fasel | C01B 32/182 |
| 10,147,603 | B2 * | 12/2018 | Lin | H01L 21/0242 |
| 2015/0345010 | A1 * | 12/2015 | Muratore | C23C 14/0623 |
| | | | | 204/192.15 |
| 2017/0170434 | A1 * | 6/2017 | Yoo | H10K 71/00 |
| 2019/0383770 | A1 * | 12/2019 | Choi | C12Q 1/68 |

OTHER PUBLICATIONS

Harald Ibach, "Physics of Surfaces and Interfaces", SpringerLink, Retrieved Mar. 30, 2023, from https://link.springer.com/book/10.1007/3-540-34710-0, total 7 pages.

Kim et al., "Preparation of atomically clean and flat Si(1 0 0) surfaces by low-energy ion sputtering and low-temperature annealing", Applied Surface Science, 2003, vol. 220, p. 293-297.

Lu et al., "Atomic Healing of Defects in Transition Metal Dichalcogenides", Nano Letters, 2005, vol. 15, p. 3524-3532.

Meng et al., "Repairing atomic vacancies in single-layer MoSe2 field-effect transistor and its defect dynamics", npj Quantum Materials, (2017), vol. 2, No. 16, p. 1-5.

Yu et al., "Towards intrinsic charge transport in monolayer molybdenum disulfide by defect and interface engineering", Nature Communications, 2014, total 7 pages.

Zhang et al., "Poly(4-styrenesulfonate)-induced sulfur vacancy self-healing strategy for monolayer MoS2 homojunction photodiode", Nature Communications, 2017, p. 1-8.

Zhu et al., "Defects and Surface Structural Stability of MoTe2 Under Vacuum Annealing", ACS Nano, 2017, vol. 11, p. 11005-11014.

* cited by examiner

<u>M</u> forming a transition metal dichalcogenide (TMD) layer on a substrate     ∼ S101 performing an ion bombardment process on the TMD layer     ∼ S102 performing an annealing process on the TMD layer     ∼ S103

602s

602

600

B-B'

B-B'

B-B'

10

B-B'

B-B'

B-B'

10

10

652          654

664

B          B'

B-B'

652          654

664
662
660B
650
664
662
660A

660 { 660B
660A 660
602s
602

W1

602SD          602CH          602SD

10

665A    602                    665B

B-B'          665A                    665B

B-B'

B-B'

10

665A    602    670    665B

W1

B-B'    665A    670    665B 664
662
660A
602s
602

W1

602SD    602CH    602SD

10

665A    602      670    665B

680

B                 B'

W1

680

B-B'     665A   670      665B 664
662
660A 602s
602

W1

602SD     602CH     602SD

SEMICONDUCTOR STRUCTURE AND MANUFACTURING METHOD THEREOF

BACKGROUND

Semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed.

In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling-down also produces a relatively high power dissipation value, which may be addressed by using low power dissipation devices such as complementary metal-oxide-semiconductor devices.

BRIEF DESCRIPTION OF THE DRAWINGSCMO

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
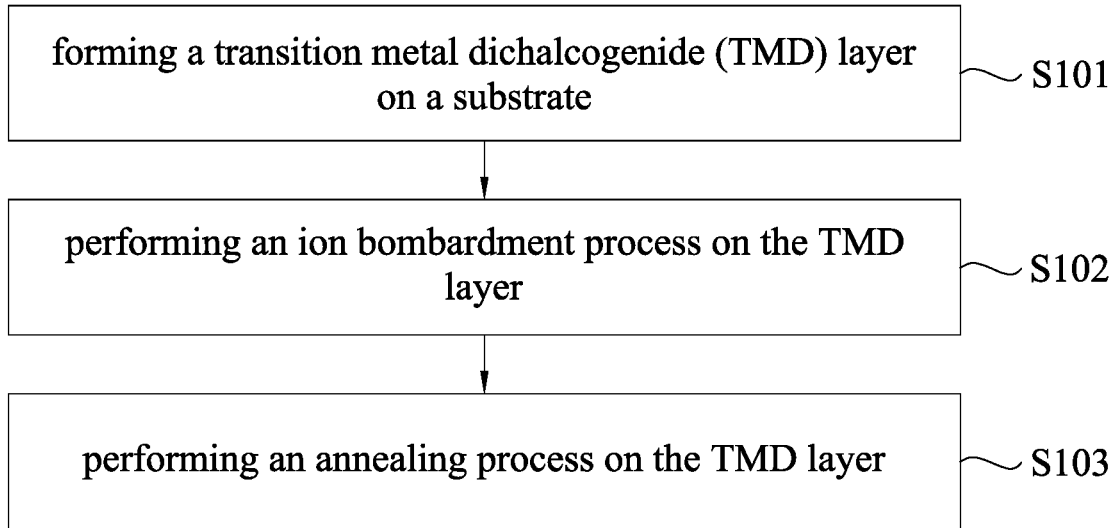
FIG. 1 is a flowchart of a method for forming a semiconductor structure in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around," "about," "approximately," or "substantially" may mean within 20 percent, or within 10 percent, or within 5 percent of a given value or range. One skilled in the art will realize, however, that the value or range recited throughout the description are merely examples, and may be reduced with the down-scaling of the ICs. Numerical quantities given herein are approximate, meaning that the term "around," "about," "approximately," or "substantially" can be inferred if not expressly stated.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

In the course of IC evolution, layered transition metal dichalcogenides (TMDs) are two-dimensional materials exhibiting a variety of features with potential for electronic and optoelectronic applications. The performance of devices fabricated with mono or few-layer TMD materials, nevertheless, can be affected by surface defects in the TMD materials. Therefore, the present disclosure in various embodiments provides a method to decrease surface defects on layered TMDs: a two-step process including an ion bombardment process and a subsequent annealing process. The ion bombardment process can produce ion-bombarded damagements destroying the bonds around the intrinsic surface defects of the layered TMDs, and the annealing process can facilitate recrystallization of damaged surfaces. This two-step process can be interchangeably referred to as an ion bombardment with annealing treatment (IBA) method. In greater detail, the ion-bombarded damagements can be recrystallized at a low temperature (e.g., lower than about 600° C.), such that the surface of the TMD layer can be restored at the low temperature accordingly. With this approach, the defects, such as chalcogen vacancies, on the surfaces of the layered TMDs can be decreased. On the other hands, if the intrinsic surface defects are remained at the surface of the layered TMDs, they would be hardly removed simply by the low temperature or even by further elevating the temperature.

Referring now to FIG. 1, illustrated is a flowchart of an exemplary method M for fabrication of a semiconductor structure in accordance with some embodiments. The method M includes a relevant part of the entire manufacturing process. It is understood that additional operations may be provided before, during, and after the operations shown by FIG. 1, and some of the operations described below can be replaced or eliminated for additional embodiments of the method. The order of the operations/processes may be interchangeable. The method M includes fabrication of a semiconductor device. However, the fabrication of the semiconductor device is merely an example for describing the manufacturing process according to some embodiments of the present disclosure.

Figure 2A:
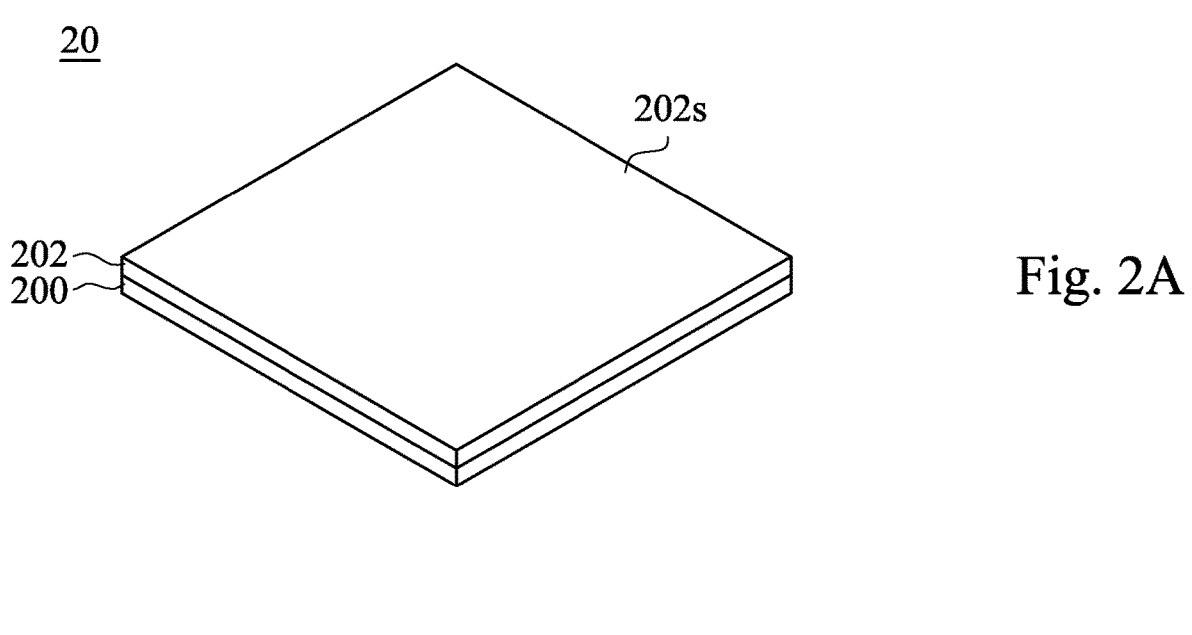
FIGS. 2A-2I illustrate a method in various stages of forming a semiconductor structure in accordance with some embodiments of the present disclosure.
Figure 2B:
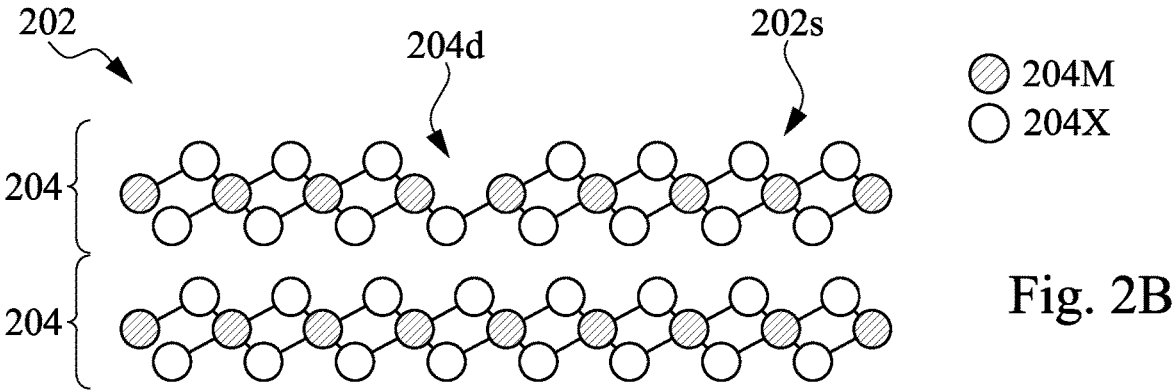
Figure 2C:
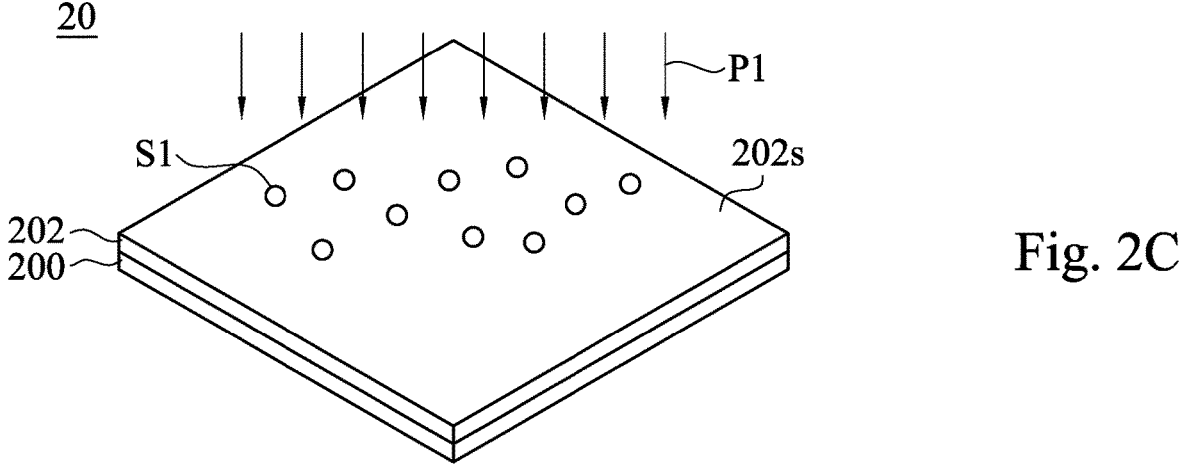
Figure 2D:
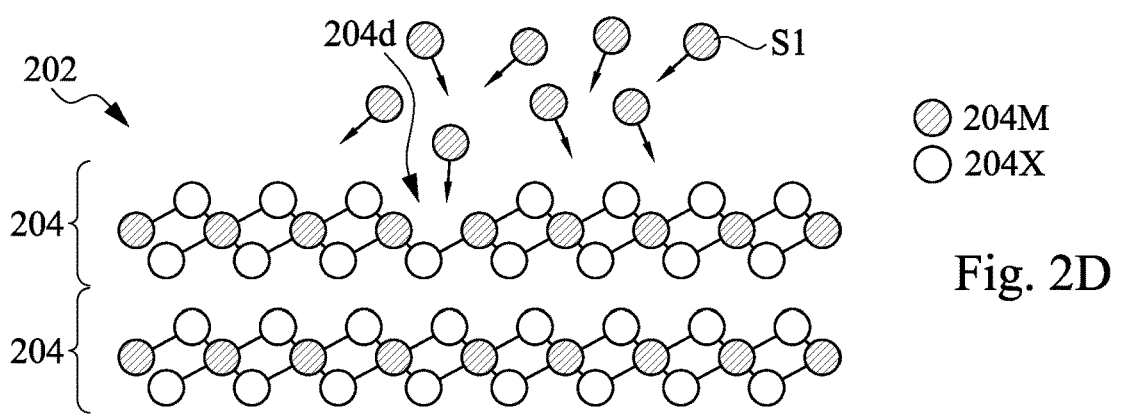
Figure 2E:
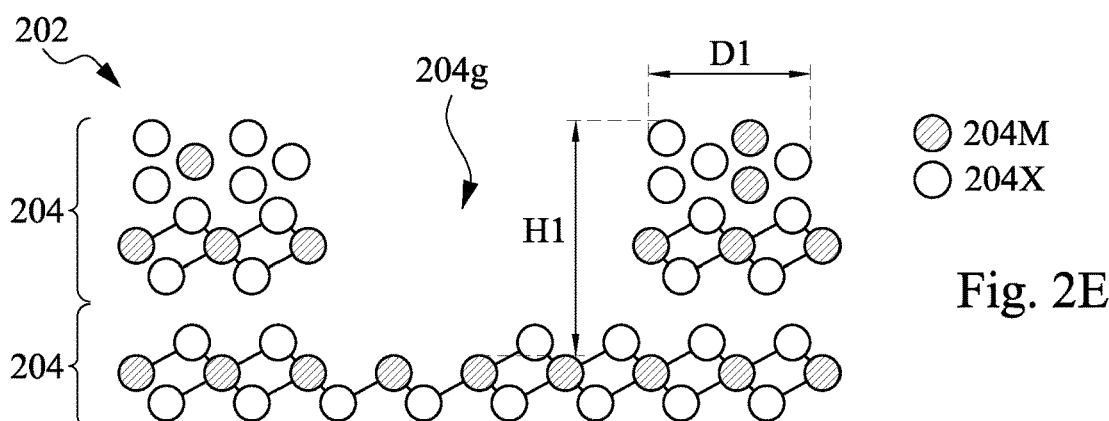
Figure 2F:
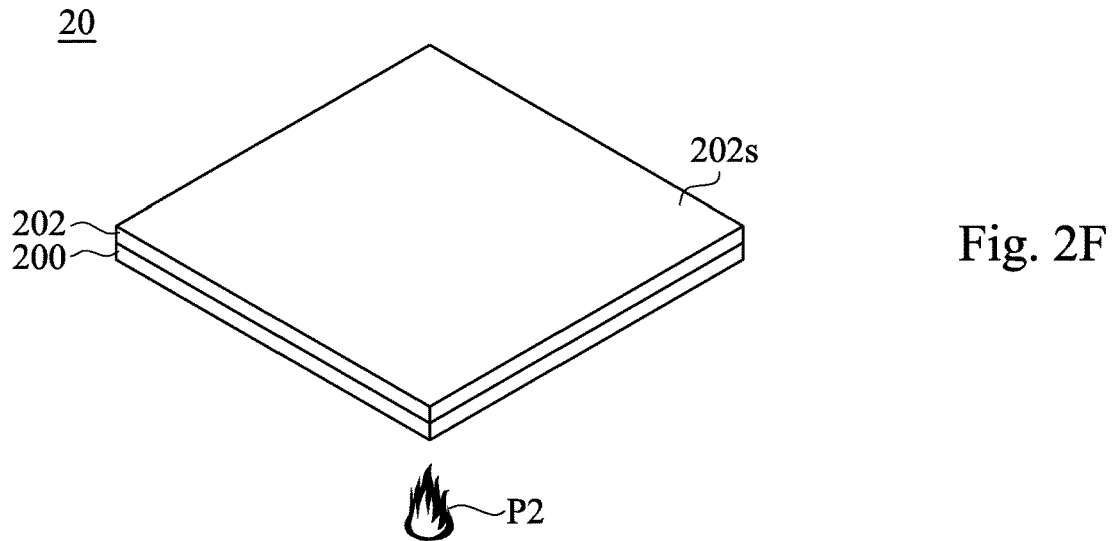

Reference is made to FIGS. 2A-2I. FIGS. 2A, 2C, and 2F illustrate perspective views of intermediate stages in formation of a semiconductor structure 20 including a TMD layer 202 in accordance some embodiments of the present disclosure and illustrate preparation for transferring the TMD layer 202 onto another substrate. FIGS. 2B, 2D, 2E, and 2G-2I illustrates schematic views of top two mono-layers 204 of the example TMD layer 202 corresponding to FIGS. 2A, 2C, and 2F in accordance with some example embodiments.

The method M begins at block S101. Referring to FIGS. 2A and 2B, in some embodiments of block S101, the TMD layer 202 is formed on a substrate 200 for crystal orientation control. In some embodiments, the substrate 200 may comprise, for example, bulk silicon, thin film, pre-pattern devices, doped or undoped, or an active layer of a semiconductor-on-insulator (SOI) substrate. In some embodiments, the substrate 200 may comprise a sapphire substrate. The sapphire substrate may be a c-plane sapphire substrate (sometimes referred to as a c-sapphire) substrate. In accordance with alternative embodiments, the substrates with other planes (such as M plane, R plane, or A plane) may be adopted. The substrate 200 may be in the form of a wafer, and may have a round top-view shape or a rectangular top-view shape. The diameter of substrate 200 may be 3 inch, 12 inch, or greater. In some embodiments, the substrate 200 is a single-crystalline substrate so that the resultant TMD layer 202 may be a single-crystalline structure with a controlled crystal orientation attributed to the substrate 200.

In some embodiments, the TMD layer 202 can have the formula $MX_2$, wherein M is a transition metal element such as titanium, vanadium, cobalt, nickel, zirconium, molybdenum, technetium, rhodium, palladium, hafnium, tantalum, tungsten, rhenium, iridium, platinum, and X is a chalcogen such as sulfur, selenium, or tellurium. Examples of dichalcogenide materials that are suitable for the TMD layer 202 include $MoS_2$, $WS_2$, $WSe_2$, $MoSe_2$, $MoTe_2$, $WTe_2$, the like, or a combination thereof. However, any suitable TMD material may alternatively be used. Once formed, the TMD material is in a layered structure with a plurality of two-dimensional layers of the general form X-M-X, with the chalcogen atoms in two planes separated by a plane of metal atoms.

The TMD layer 202 may be a mono-layer or may include a few mono-layers. In FIG. 2B, the one-molecule thick TMD material layer comprises transition metal atoms 204M and chalcogen atoms 204X. The transition metal atoms 204M may form a layer in a middle region of the one-molecule thick TMD material layer, and the chalcogen atoms 204X may form a first layer over the layer of transition metal atoms 204M, and a second layer underlying the layer of transition metal atoms 204M. The transition metal atoms 204M may be W atoms or Mo atoms, while the chalcogen atoms 204X may be S atoms, Se atoms, or Te atoms. In the example of FIG. 2B, each of the transition metal atoms 204M is bonded (e.g. by covalent bonds) to six chalcogen atoms 204X, and each of the chalcogen atoms 204X is bonded (e.g. by covalent bonds) to three transition metal atoms 204M. Throughout the description, the illustrated cross-bonded layers including one layer of transition metal atoms 204M and two layers of chalcogen atoms 204X in combination are referred to as a mono-layer 204 of TMD.

In some embodiments, the TMD layer 202 is grown on the substrate 200 by using suitable deposition techniques. For example, in some embodiments where the TMD layer 202 is TMD, the TMD layer 202 may be formed using chemical vapor deposition (CVD), with $MoO_3$ and a sulfur-containing gas such as sulfur vapor or $H_2S$ as process gases and $N_2$ as a carrier gas. The formation temperature may be between about 600° C. and about 700° C. in accordance with some exemplary embodiments, and higher or lower temperatures may be used. The process conditions are controlled to achieve the desirable total count of mono-layers 204. In accordance with alternative embodiments, plasma-enhanced CVD (PECVD) or other applicable methods are used. In some embodiments, the TMD layer 202 grown on the substrate 200 may include crystalline defects 204d, such as chalcogen vacancy defects, interstitial defects, and/or other defects, and thus the TMD layer 202 may be called a defective 2D semiconductor layer in some embodiments of the present disclosure. Although the defective TMD layer 202 includes crystalline defects, it still includes an expected or controlled crystal orientation depending on the crystal orientation of the underlying substrate 200. In some embodiments, the defective TMD layer 202 may be grown in a form of defective 2D semiconductor flakes or a continuous defective 2D semiconductor film. In some embodiments, a surface 202s of the TMD layer 202 is as-cleaved. The defective TMD layer 202 can be then transferred onto the interlayer dielectric (ILD) layer 120 (see FIGS. 9A-15B) of the wafer W1 and used in forming transistors.

Specifically, layered TMDs are two-dimensional materials exhibiting a variety of features with potential for electronic and optoelectronic applications. The performance of devices fabricated with mono or few-layer TMD materials, nevertheless, can be affected by surface defects in the TMD materials. An approach to decrease surface defects on layered TMDs is provided: a two-step process including an ion bombardment process P1 (see FIG. 2C) and a subsequent annealing process P2 (see FIG. 2F). The ion bombardment process P1 can produce ion-bombarded damagements 204g (see FIG. 2E) destroying the bonds around the crystalline defects 204d (see FIG. 2D), and the annealing process P2 can facilitate recrystallization of the damaged surfaces. This two-step process can be interchangeably referred to as an IBA method. In greater detail, the ion-bombarded damagements 204g have greater dimension than the crystalline defects 204d and can be recrystallized at a low temperature (e.g., lower than about 600° C.), such that the surface 202s of the TMD layer 202 can be restored at the low temperature (see FIGS. 2G-2I) accordingly. With this approach, the defects, such as chalcogen vacancies (e.g., Te vacancies), on the surface 202s of the as-cleaved TMD layer (e.g., the surface of PtTe2, PdTe$_2$ layer) can be decreased by more than about 99%, giving a defect density lower than about $1.0 \times 10^{10}$ $cm^{-2}$. On the other hand, if the surface crystalline defects 204d are remained at the surface 202s of the TMD layer 202, they would be hardly removed simply by the low temperature or even by further elevating the temperature.

Referring back to FIG. 1, the method M then proceeds to block S102 where an ion bombardment process is performed on the TMD layer. With reference to FIGS. 2C-2E, in some embodiments of block S102, an ion bombardment process P1 is performed on the TMD layer 202. After the TMD layer 202 is bombarded, the surface 202s of the TMD layer 202 becomes rough with nanogranule and forms ion-bombarded damagements 204g (see FIG. 2E), such as holes, clusters, and/or other defects, thereon, and the surface crystallinity of the TMD layer 202 can be attenuated. The ion-bombarded damagement 204g can destroy the bonds around the crystalline defect 204d (see FIG. 2D) and have a greater dimension than the crystalline defect 204d. In some embodiments, not only the upper one of the top two mono-layers 204 in the TMD layer 202 but also the lower one of the top two mono-layers 204 in the TMD layer 202 can be damaged by the bombardment (see FIG. 2E), and some chalcogen atoms 204X and transition metal atoms 204M can be redeposited on the surface of the TMD layer 202.

In some embodiments, the nanogranules may be with a diameter D1 (see FIG. 2E) in a range from about 1 nm to about 10 nm, such as about 1, 2, 3, 4, 5, 6, 7, 8, 9, or 10 nm, and a height H1 (see FIG. 2E) deeper than an atom and in a range from about 0.1 nm to about 1 nm, such as 0.1, 0.2, 0.3, 0.4, 0.5, 0.6, 0.7, 0.8, 0.9, or 1 nm. In some embodiments, after the ion bombardment process P1, the surface 202s of the TMD layer 202 may be formed by amorphous crystals or polycrystals, or grain regions. In some embodiments, the ion bombardment process P1 can use an ion source S1 including inert gas having atomic weight less than about 50, such as He, Ne, Ar, in a plasma state. In some embodiments, the ion source S1 used in the ion bombardment process P1 may include positively (e.g. Ar$^+$) or negatively charged ions. In some embodiments, the ion bombardment process P1 can have an ion bombardment energy in a range from about 0.1 keV to about 2.0 keV, such as about 0.1, 0.5, 1, 1.5, or 2 keV. In some embodiments, the ion bombardment process P1 can have a process time duration in a range from about 1 to about 30 minutes, such as about 1, 3, 5, 10, 15, 20, 25, or 30 minutes. In some embodiments, the ion bombardment process P1 can be performed under a pressure lower than about $1 \times 10^{-5}$ Torr.

Figure 2G:
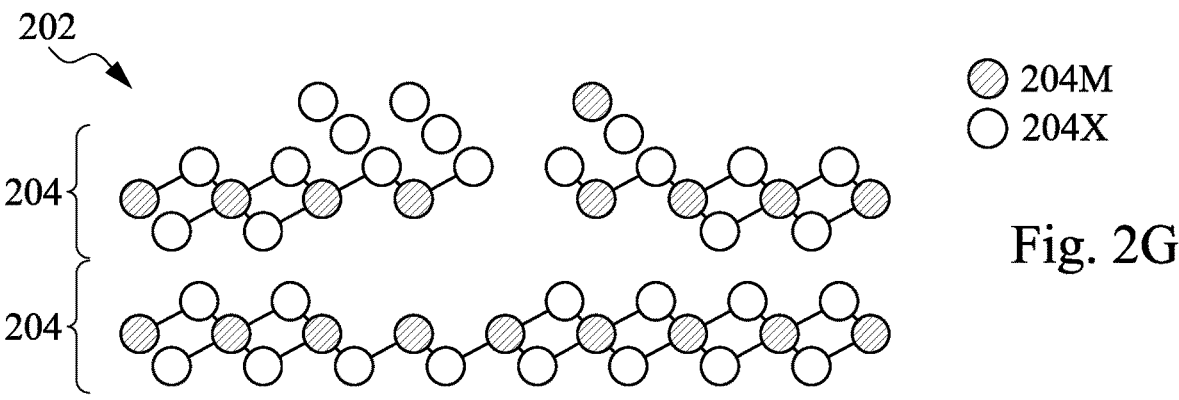
Figure 2H:
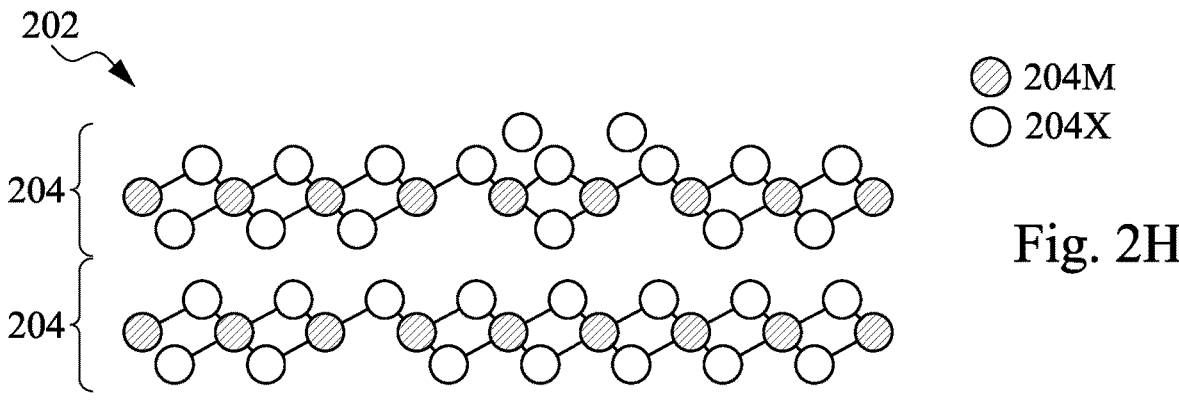
Figure 2I:
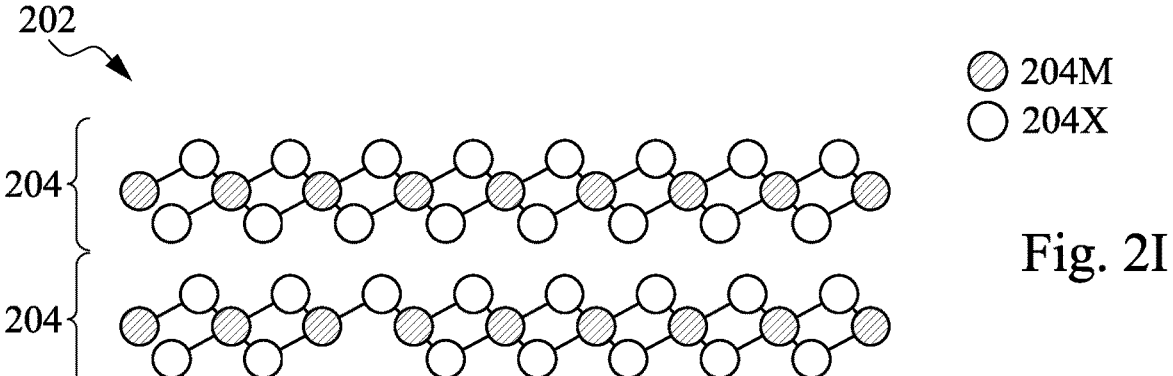

Referring back to FIG. 1, the method M then proceeds to block S103 where an annealing process is performed on the TMD layer. With reference to FIGS. 2F-2I, in some embodiments of block S103, an annealing process P2 is performed on the TMD layer 202. The annealing process P2 initiates recrystallization or restoration of the long-range ordering on the TMD layer 202. Specifically. FIGS. 2G-2I sequentially illustrate that the surface 202s of the TMD layer 202 with the ion-bombarded damagements 204g can be healed by the annealing process P2. In this stage, some chalcogen atoms 204X and transition metal atoms 204M diffuse to recrystallize the surface 202s of the TMD layer 202 that may follow the orientation below the surface and have a same topography variation as the layer below the surface. The outermost surface of the TMD layer 202 can be first crystallized, which warrants no crystalline defect 204d (e.g., chalcogen vacancy) at the surface 202s of the TMD layer 202 when the whole sample is nearly recrystallized. If a few vacancies remained at the surface 202s of the TMD layer 202 in this stage instead of turning into the ion-bombarded damagements 204g, they would be hardly removed simply by the low temperature or even by further elevating the temperature. Subsequently, some vacancies could be buried underneath, and some atoms could remain atop the surface 202s as shown in FIG. 2I. These vacancies could diffuse toward the interior of the TMD layer 202 and/or the edge of the TMD layer 202, or be amended by migrating adatoms through a chain process. Finally, an almost defect-free surface can be obtained.

With increasing annealing temperature, the granular structures as shown in FIG. 2E gradually vanished—the grain boundaries migrated, rearranged and disappeared (see FIGS. 2G-2I). After the annealing process P2 is complete, the surface 202s of the TMD layer 202 can be perfectly restored, with nearly no surface defects (FIG. 2I), the density of surface defects can be less than about $1.0 \times 10^{10}$ cm$^{-2}$ (counts by areas>about 10000 nm$^2$), by way of example but not limiting the present disclosure. In some embodiments, the annealing process P2 can be performed at a temperature in a range from about 100° C. to about 600° C., such as about 100, 200, 300, 400, 500, or 600° C. In some embodiments, the temperature of the annealing process P2 can be ramped up or directly set to the recrystallization temperature. In some embodiments, the annealing process P2 is performed under a pressure lower than about $1 \times 10^{-5}$ Torr. In some embodiments, a precursor can be introduced on the TMD layer 202 during the annealing process P2 to form a precursor-rich ambient around the TMD layer 202, and the precursor may include chalcogen element (e.g., Te, Se, or S) that is the same as chalcogen atom 204X in the TMD layer 202.

In some embodiments, the ion bombardment process P1 and the annealing process P2 in the IBA method may be performed sequentially or simultaneously. In some embodiments, the ion bombardment process P1 and the annealing process P2 in the IBA method may be performed in-situ or ex-situ. In some embodiments, the IBA method can be a cyclic process including at least one repetition of an ion bombardment process and an annealing process. For example, it may perform an ion bombardment process P1 (e.g., FIG. 2C) followed by an annealing process P2 (e.g., FIG. 2F), and repeats the ion bombardment process P1 and the annealing process P2.

Some experimental results of scanning tunneling microscope (STM) images on a PtTe$_2$ layer performed the IBA method as the TMD layer 202 shown in FIGS. 2A-2I were observed, so as to monitor the morphological evolution of the PtTe$_2$ layer during the IBA method. Intrinsic defects can be observed on the as-cleaved surface of the PtTe$_2$ layer in the STM image prior to performing an ion bombardment process on the PtTe$_2$ layer. After the ion bombardment process, the regions on the PtTe$_2$ layer with defects were preferentially destroyed, exhibiting holes and/or clusters. By way of example but not limiting the present disclosure, the ion bombardment process used in this sample may have an ion bombardment energy about 0.5 keV, an ion source being Ar$^+$, and a time duration about 3 mins. Subsequently, an annealing process is performed on the PtTe$_2$ layer to initiate recrystallization or restoration of the long-range ordering on the PtTe$_2$ layer. The annealing process is performed by gradually increasing the annealing temperature until about 470° C. After the annealing process, the surface of the PtTe$_2$ was restored layer and become well-order and defect-free. By way of example but not limiting the present disclosure, the density of surface defects was less than about $1.0 \times 10^{10}$ cm$^{-2}$ (counts by areas>about 10000 nm$^2$). This result suggests that the IBA method not only restores the surface of the PtTe$_2$ layer but also significantly decreases the surface defects on the PtTe$_2$ layer.

Some experimental results of STM images on a PdTe$_2$ layer performed the IBA method as the TMD layer 202 shown in FIGS. 2A-2I were observed, so as to monitor the morphological evolution of the PdTe$_2$ layer during the IBA method. Intrinsic defects can be observed on the as-cleaved surface of the PdTe$_2$ layer in the STM image prior to performing an ion bombardment process on the PdTe$_2$ layer. After the ion bombardment process, the regions on the PdTe$_2$ layer with defects were preferentially destroyed, exhibiting holes and/or clusters. By way of example but not limiting the present disclosure, the ion bombardment process used in this sample may have an ion bombardment energy about 0.5 keV, an ion source being Ar+, and a time duration about 3 mins. Subsequently, an annealing process is performed on the PdTe$_2$ layer to initiate recrystallization or restoration of the long-range ordering on the PdTe$_2$ layer. The annealing process is performed by gradually increasing the annealing temperature until about 220° C. After the annealing process, the surface of the PtTe$_2$ was restored layer and become well-order and defect-free. By way of example but not limiting the present disclosure, the density of surface defects was less than about $1.0 \times 10^{10}$ cm$^{-2}$ (counts by areas>about 10000 nm$^2$). This result suggests that the IBA method not only restores the surface of the PdTe$_2$ layer but also significantly decreases the surface defects on the PdTe$_2$ layer.

Some experimental results of STM images on a PtTe$_2$ layer formed on a bilayer graphene and performed the IBA method as the TMD layer 202 shown in FIGS. 2A-2I were observed, so as to monitor the morphological evolution of the PtTe$_2$ layer formed on the bilayer graphene during the IBA method. Intrinsic defects can be observed on the as-cleaved surface of the PtTe$_2$ layer in the STM image prior to performing an ion bombardment process on the PtTe$_2$ layer. After the ion bombardment process, the regions on the PtTe$_2$ layer with defects were preferentially destroyed, exhibiting holes and/or clusters. By way of example but not limiting the present disclosure, the ion bombardment process used in this sample may have an ion bombardment energy about 0.5 keV, an ion source being Ar+, and a time duration about 3 mins, and conduct in a Te-rich ambient under a pressure about $1 \times 10^{-8}$ Torr. Subsequently, an annealing process is performed on the PtTe$_2$ layer to initiate recrystallization or restoration of the long-range ordering on the PtTe$_2$ layer. The annealing process is performed by gradually increasing the annealing temperature until about 230° C. under a pressure about $1 \times 10^{-8}$ Torr in a Te-rich ambient. After the annealing process, the surface of the PtTe$_2$ was restored layer and become well-order and defect-free. By way of example but not limiting the present disclosure, the density of surface defects was less than about $1.0 \times 10^{10}$ cm$^{-2}$ (counts by areas>about 10000 nm$^2$). This result suggests that the IBA method not only restores the surface of the PtTe$_2$ layer but also significantly decreases the surface defects on the PtTe$_2$ layer.

Figure 3A:
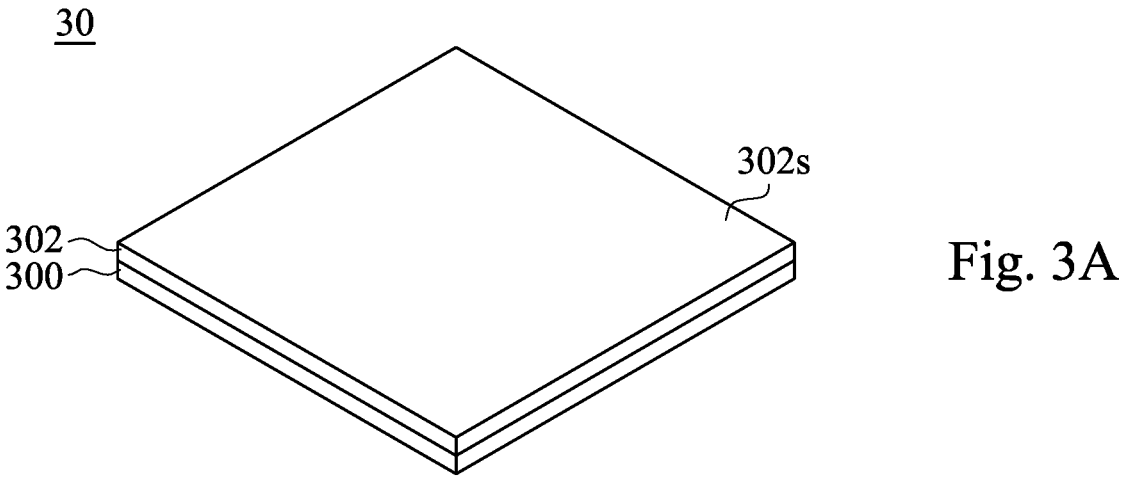
FIGS. 3A and 3B illustrate a method in various stages of forming a semiconductor structure in accordance with some embodiments of the present disclosure.
Figure 3B:
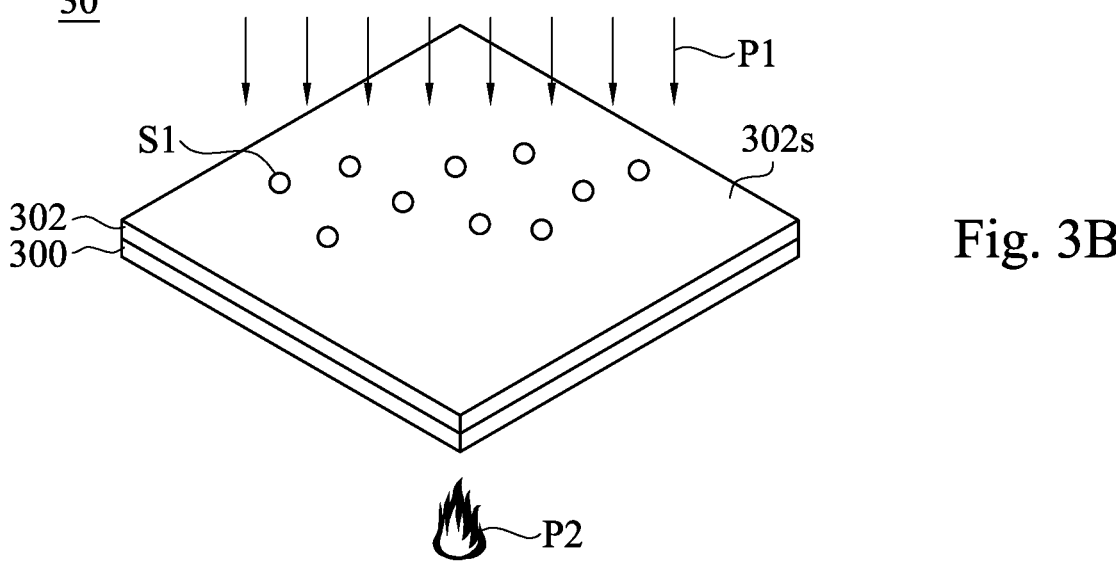

Reference is made to FIGS. 3A and 3B. FIGS. 3A and 3B illustrate a method in various stages of forming a semiconductor structure 30 in accordance with some embodiments of the present disclosure. Operations for forming the semiconductor structure 30 are substantially the same as the operations for forming the semiconductor structure 20 described in foregoing descriptions and thus are not repeated herein for the sake of clarity. For example, material and manufacturing method of a substrate 300 and a TMD layer 302 may be substantially the same as that of the substrate 200 and the TMD layer 202 and the related detailed descriptions may refer to the foregoing paragraphs, and are not described again herein. The difference between the present embodiment and the embodiment in FIGS. 2A to 2I is that the ion bombardment process P1 and the annealing process P2 are performed simultaneously. With this approach, the defects, such as chalcogen vacancies (e.g., Te vacancies), on the surface 302s of the as-cleaved TMD layer 302 can be decreased. By way of example but not limiting the present disclosure, after the IBA method as shown in FIGS. 3A and 3B is performed, the density of surface defects on the TMD layer 302 can be less than about $1.0 \times 10^{10}$ cm$^{-2}$ (counts by areas>about 10000 nm$^2$).

Figure 4A:
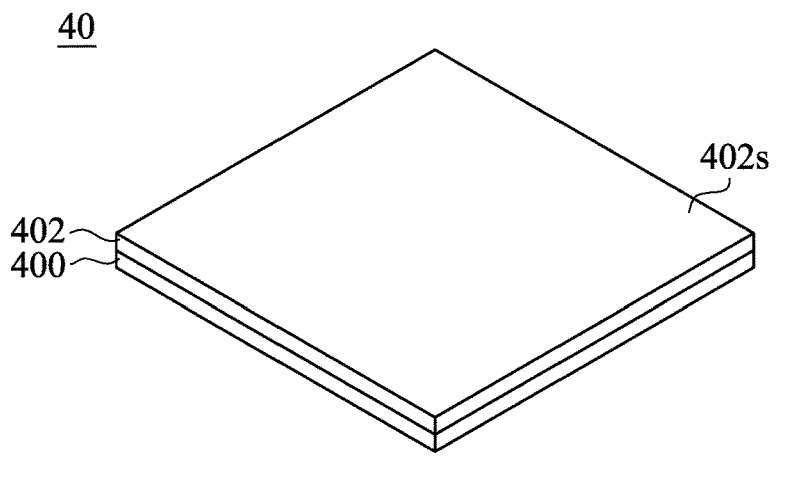
FIGS. 4A-4C illustrate a method in various stages of forming a semiconductor structure in accordance with some embodiments of the present disclosure.
Figure 4B:
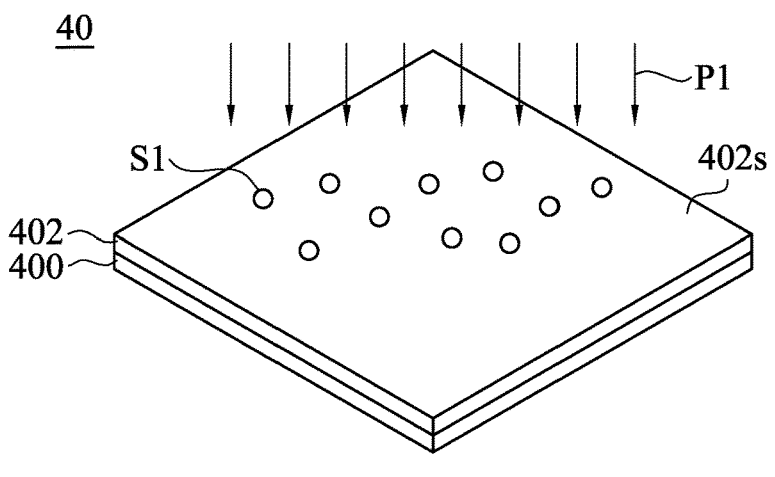
Figure 4C:
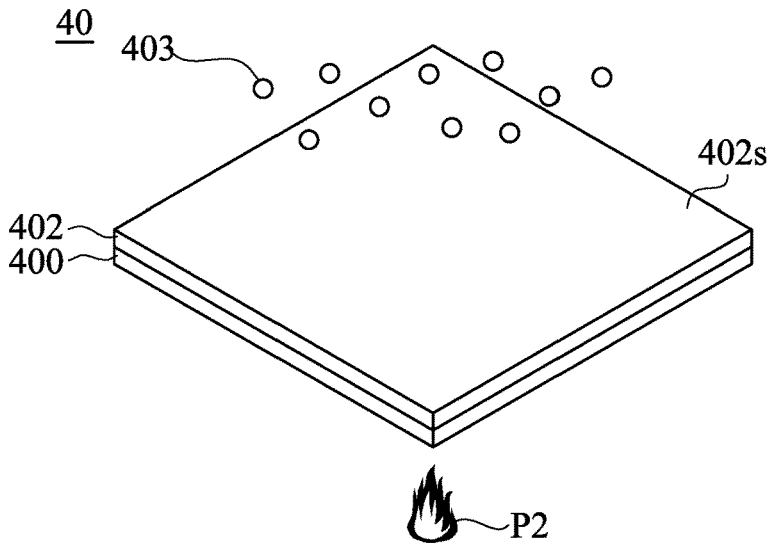

Reference is made to FIGS. 4A-4C. FIGS. 4A-4C illustrate a method in various stages of forming a semiconductor structure 40 in accordance with some embodiments of the present disclosure. Operations for forming the semiconductor structure 40 are substantially the same as the operations for forming the semiconductor structure 20 described in foregoing descriptions and thus are not repeated herein for the sake of clarity. For example, material and manufacturing method of a substrate 400 and a TMD layer 402 may be substantially the same as that of the substrate 200 and the TMD layer 202 and the related detailed descriptions may refer to the foregoing paragraphs, and are not described again herein. The difference between the present embodiment and the embodiment in FIGS. 2A to 2I is that a precursor 403 can be introduced on the TMD layer 402 during the annealing process P2 to form a precursor-rich ambient around the TMD layer 402. The precursor 403 may include chalcogen element (e.g., Te, Se, or S) that is the same as the chalcogen atom in the TMD layer 402. With this approach, the defects, such as chalcogen vacancies (e.g., Te vacancies), on the surface 402s of the as-cleaved TMD layer 402 can be decreased. By way of example but not limiting the present disclosure, after the IBA method as shown in FIGS. 4A-4C is performed, the density of surface defects on the TMD layer 402 can be less than about $1.0 \times 10^{10}$ cm$^{-2}$ (counts by areas>about 10000 nm$^2$).

Figure 5A:
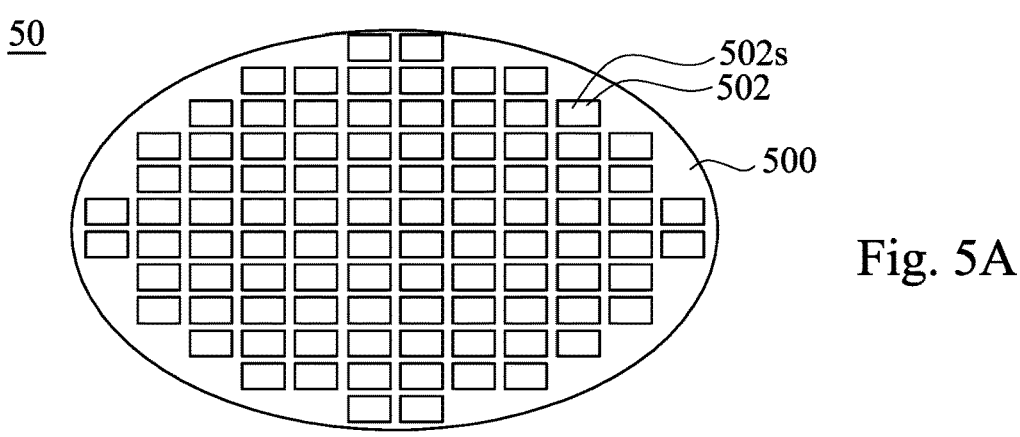
FIGS. 5A-5C illustrate a method in various stages of forming a semiconductor structure in accordance with some embodiments of the present disclosure.
Figure 5B:
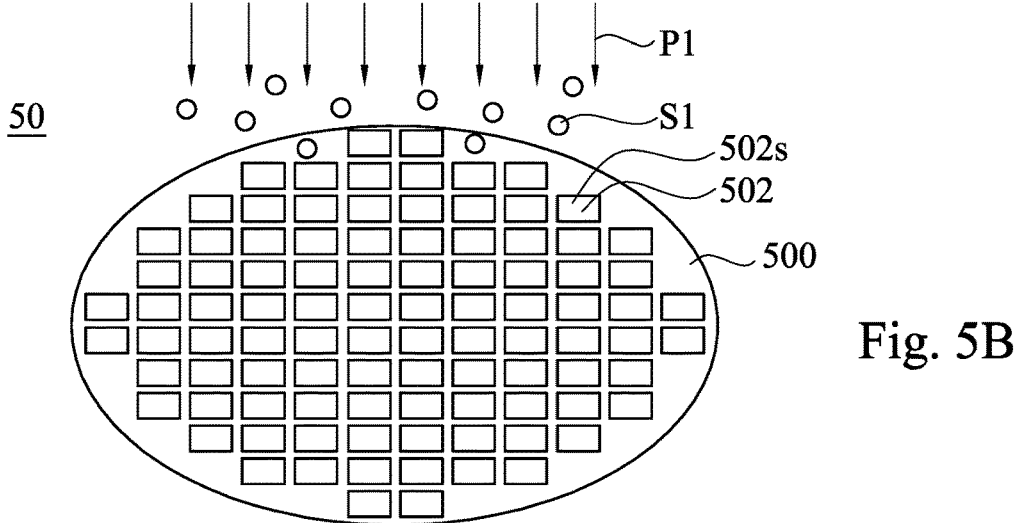
Figure 5C:
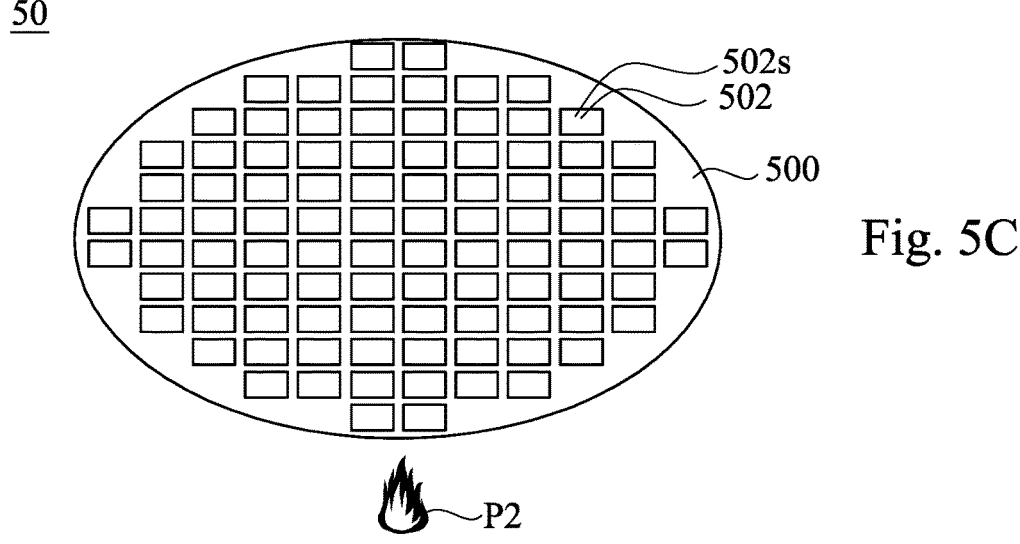

Reference is made to FIGS. 5A-5C. FIGS. 5A-5C illustrate a method in various stages of forming a semiconductor structure 50 in accordance with some embodiments of the present disclosure. Operations for forming the semiconductor structure 50 are substantially the same as the operations for forming the semiconductor structure 20 described in foregoing descriptions and thus are not repeated herein for the sake of clarity. For example, material and manufacturing method of a TMD layer 502 may be substantially the same as that of the TMD layer 202 and the related detailed descriptions may refer to the foregoing paragraphs, and are not described again herein. The difference between the present embodiment and the embodiment in FIGS. 2A to 2I is that before the ion bombardment process P1 is performed (see FIG. 5B), the TMD layer 502 is transferred to a substrate 500 in a form of a wafer having a plurality of pre-patterned devices formed thereon (FIG. 5A). Because the IBA method can be performed on the semiconductor structure 50 at a temperature lower than lower than about 400° C., a lower thermal budget to decrease surface defects on the TMD layer 502 can be reached, such that the performance of the devices on the substrate 500 can be improved. With this approach, the defects, such as chalcogen vacancies (e.g., Te vacancies), on the surface 502s of the as-cleaved TMD layer 502 can be decreased. By way of example but not limiting the present disclosure, after the IBA method as shown in FIGS. 5A-5C is performed, the density of surface defects on the TMD layer 502 can be less than about $1.0 \times 10^{10}$ cm$^{-2}$ (counts by areas>about 10000 nm$^2$).

Reference is made to FIGS. 6-15B. FIGS. 6-15B illustrate a method in various stages of forming a semiconductor structure 10 in accordance with some embodiments of the present disclosure.

Figure 6:
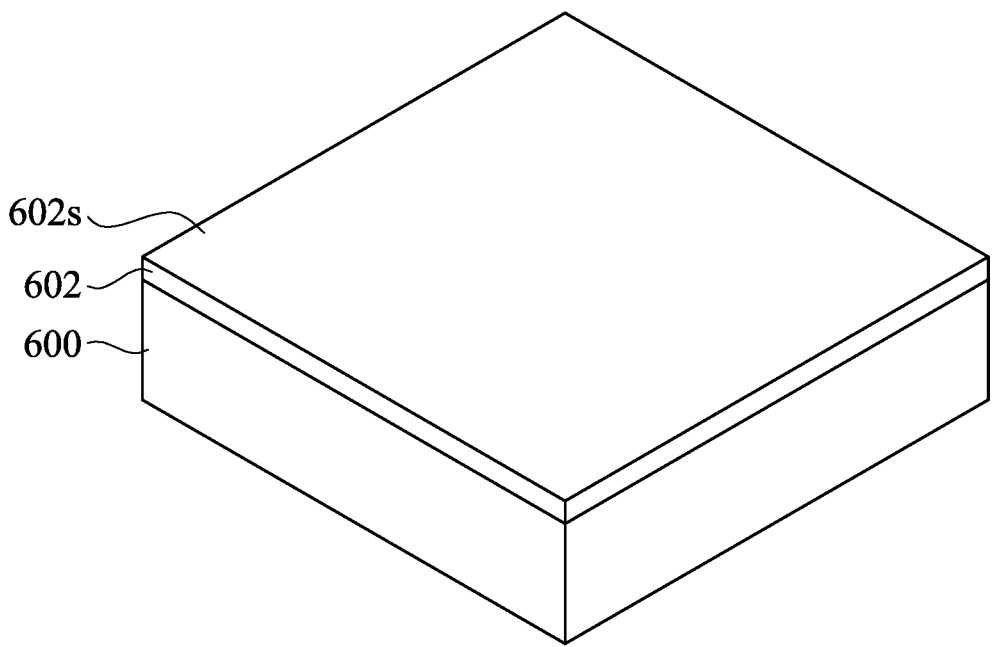
FIGS. 6-15B illustrate a method in various stages of forming a semiconductor structure in accordance with some embodiments of the present disclosure.

Reference is made to FIG. 6. A TMD layer 602 is formed on a substrate 600 for crystal orientation control. In some embodiments, the TMD layer 602 grown on the substrate 600 may include crystalline defects, such as chalcogen vacancy defects, interstitial defects, and/or other defects, and thus the TMD layer 602 may be called a defective 2D semiconductor layer in some embodiments of the present disclosure. Although the defective TMD layer 602 includes crystalline defects, it still includes an expected or controlled crystal orientation depending on the crystal orientation of the underlying crystalline substrate 600. In some embodiments, material and manufacturing method of the substrate 600 and the TMD layer 602 are substantially the same as those of the substrate 200 and the TMD layer 202 as shown in FIGS. 2A-2I, and the related detailed descriptions may refer to the foregoing paragraphs, and are not described again herein.

Figure 7:
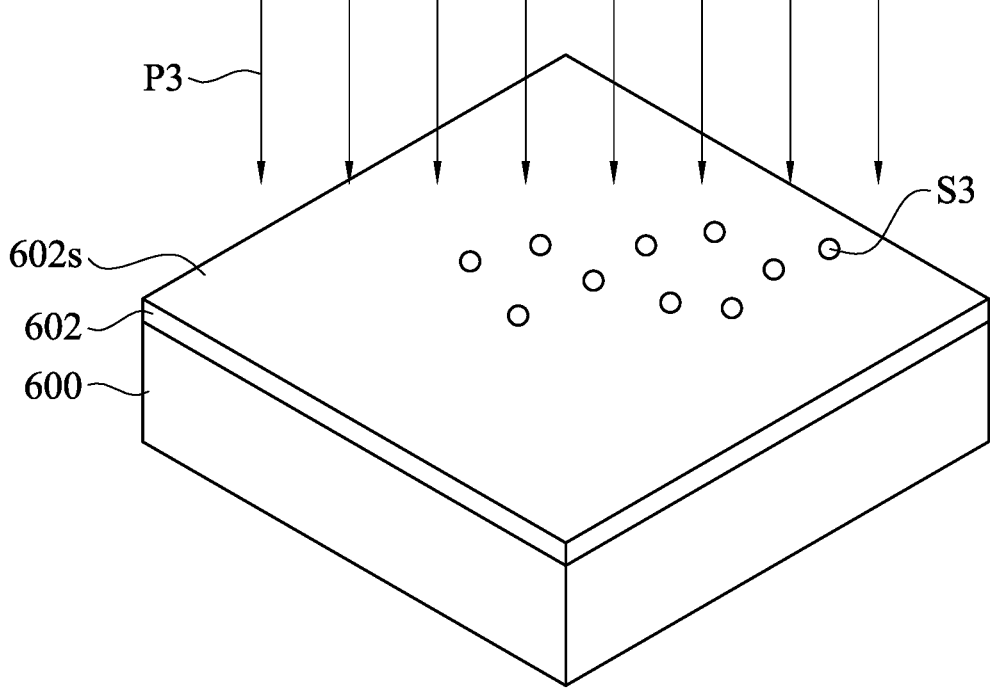
Figure 8:
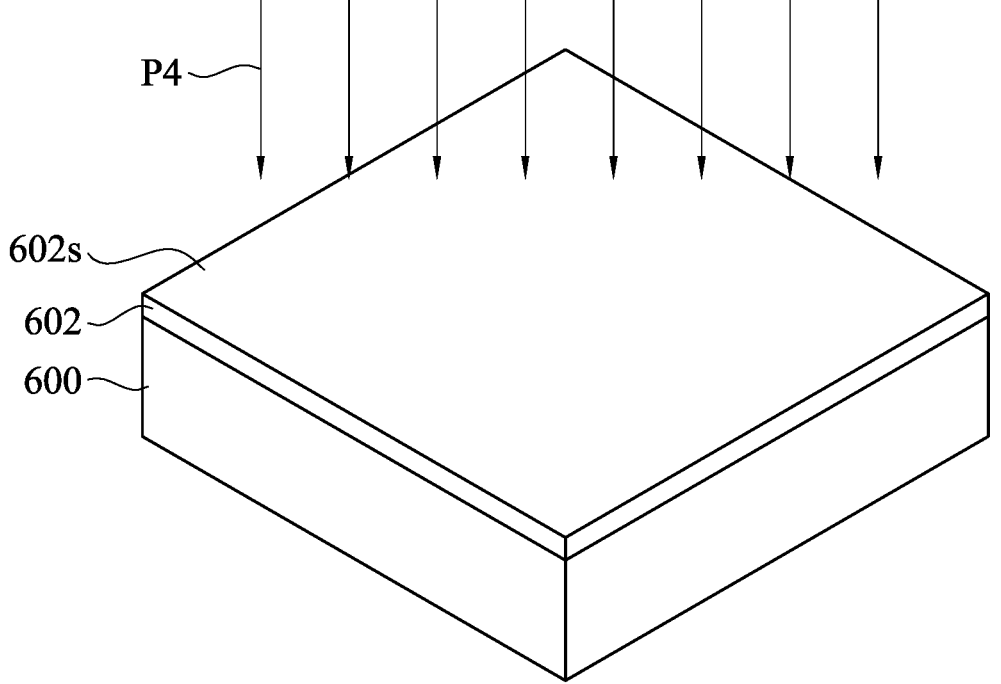

Reference is made to FIGS. 7 and 8. An IBA method includes an ion bombardment process P3 and an annealing process P4 can be performed on the TMD layer 602 to decrease surface defects on the TMD layer 602. As shown in FIG. 7, the ion bombardment process P3 is performed on the TMD layer 602. After the TMD layer 602 is bombarded, the surface 602s of the TMD layer 602 becomes rough with nanogranule and forms ion-bombarded damagements, such as holes, clusters, and/or other defects, thereof, and the surface crystallinity of the TMD layer 602 can be attenuated. The ion-bombarded damagement can destroy the bonds around the crystalline defect and have a greater dimension than the crystalline defect. In some embodiments, after the ion bombardment process P3, the surface 602s of the TMD layer 602 may be formed by amorphous crystals or polycrystals, or grain regions. In some embodiments, the ion bombardment process P3 can use an ion source S3 including inert gas having atomic weight less than about 50, such as He, Ne, Ar, in a plasma state. In some embodiments, the ion source S3 used in the ion bombardment process P3 may include positively (e.g. Ar$^+$) or negatively charged ions. In some embodiments, the ion bombardment process P3 can have an ion bombardment energy in a range from about 0.1 keV to about 2.0 keV, such as about 0.1, 0.5, 1, 1.5, or 2 keV. In some embodiments, the ion bombardment process P3 can have a process time duration in a range from about 1 to about 30 minutes, such as about 1, 3, 5, 10, 15, 20, 25, or 30 minutes. In some embodiments, the ion bombardment process P3 can be performed under a pressure lower than about 1×10-5 Torr.

Reference is made to FIG. 8. After the ion bombardment process P3, the annealing process P4 is performed on the TMD layer 602. The annealing process P4 initiates recrystallization or restoration of the long-range ordering on the TMD layer 602. The TMD layer 602 with the ion-bombarded damagements can be healed by the annealing process P4. In this stage, some chalcogen atoms and transition metal atoms diffuse to recrystallize the surface 602s of the TMD layer 602. The outermost surface of the TMD layer 602 can be first crystallized, which warrants no crystalline defect (e.g., chalcogen vacancy) at the surface 602s of the TMD layer 602 when the whole sample is nearly recrystallized. If a few vacancies remained at the surface 602s of the TMD layer 602 in this stage instead of turning into the ion-bombarded damagements, they would be hardly removed simply by the low temperature or even by further elevating the temperature. Subsequently, some vacancies could be buried underneath, and some atoms could remain atop the surface 602s as shown in FIG. 21. These vacancies could diffuse toward the interior of the TMD layer 602 and/or the edge of the TMD layer 602, or be amended by migrating adatoms through a chain process.

After the annealing process P4 is complete, the surface 602s of the TMD layer 602 can be perfectly restored, with nearly no surface defects, the density of surface defects can be less than about 1.0×10$^{10}$ cm$^{-2}$ (counts by areas>about 10000 nm$^2$), by way of example but not limiting the present disclosure. In some embodiments, the annealing process P4 can be performed at a temperature in a range from about 100° C. to about 600° C., such as about 100, 200, 300, 400, 500, or 600° C. In some embodiments, the temperature of the annealing process P4 can be ramped up or directly set to the recrystallization temperature. In some embodiments, the annealing process P4 is performed under a pressure lower than about 1×10$^{-5}$ Torr. In some embodiments, a precursor can be introduced on the TMD layer 602 during the annealing process P4 to form a precursor-rich ambient around the TMD layer 602, and the precursor may include chalcogen element (e.g., Te, Se, or S) that is the same as chalcogen atom in the TMD layer 602.

In some embodiments, the ion bombardment process P3 and the annealing process P4 in the IBA method may be performed sequentially or simultaneously. In some embodiments, the ion bombardment process P3 and the annealing process P4 in the IBA method may be performed in-situ or ex-situ. In some embodiments, the IBA method can be a cyclic process including at least one repetition of an ion bombardment process and an annealing process. For example, it may perform an ion bombardment process P3 (e.g., FIG. 7) followed by an annealing process P4 (e.g., FIG. 2F), and repeats the ion bombardment process P3 and the annealing process P4.

Figure 9A:
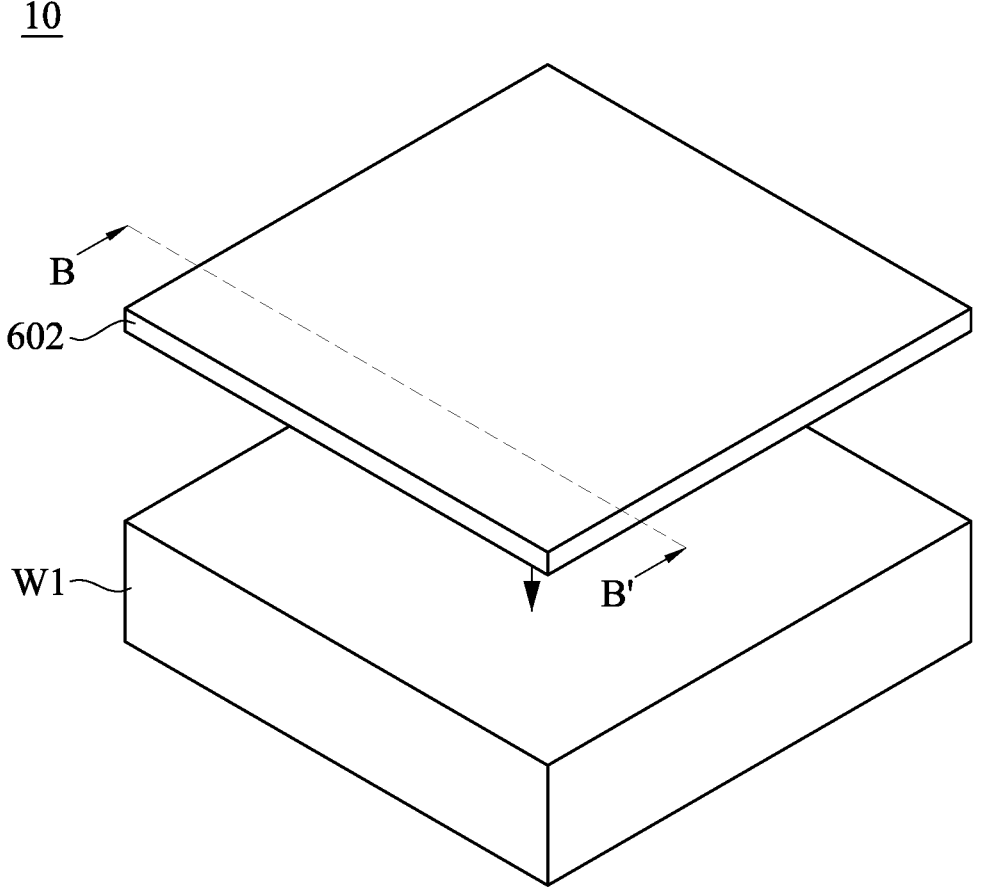
Figure 9B:
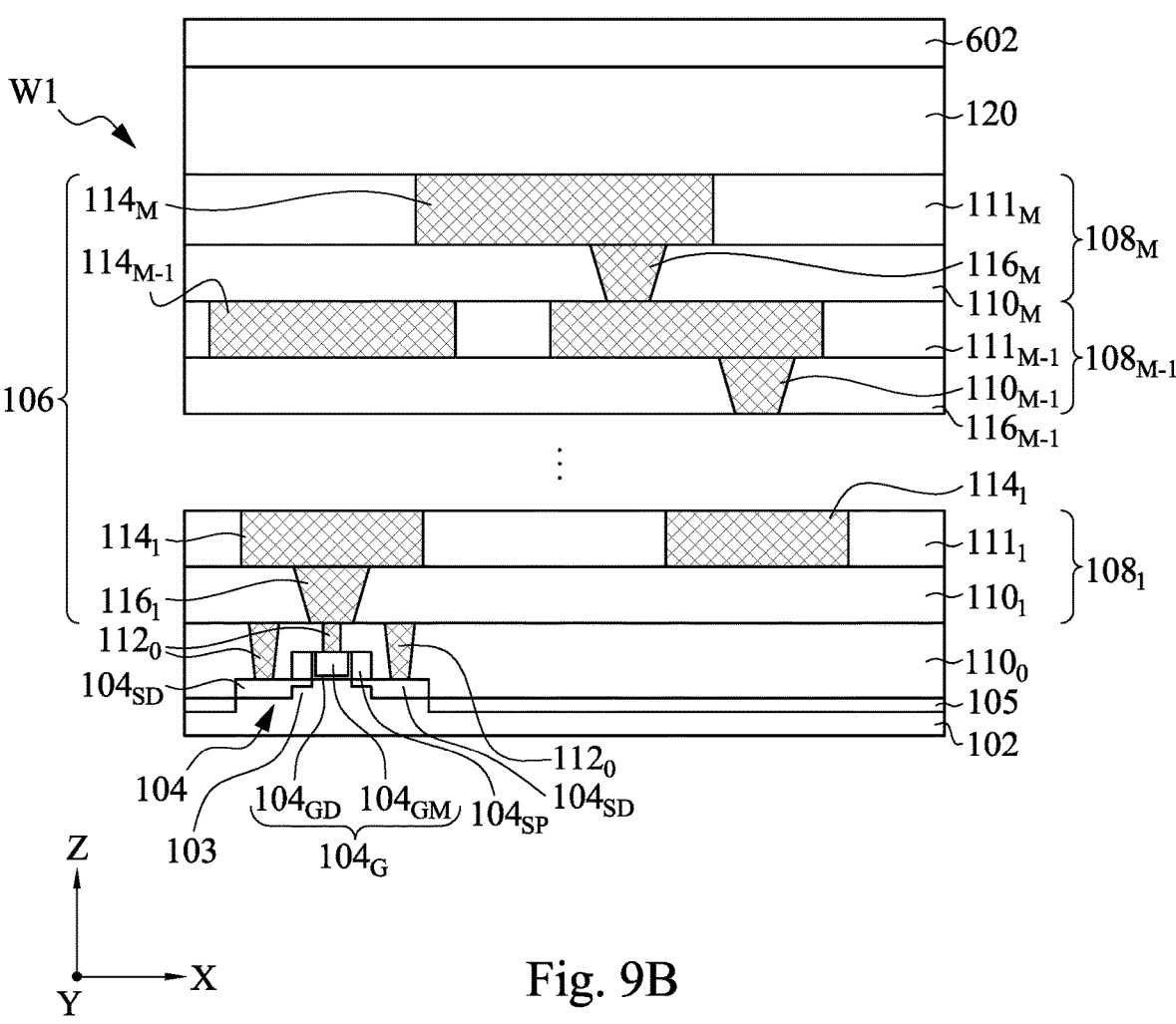

Reference is made to FIGS. 9A and 9B. FIG. 9A illustrates a perspective view of an intermediate structure of a wafer W1 with the TMD layer 602 in an IC manufacturing process in accordance with some embodiments of the present disclosure, and FIG. 9B is a cross sectional view of FIG. 9A along line B-B' of FIG. 9A. In FIGS. 9A and 9B, the semiconductor wafer W1 is an intermediate structure of an IC manufacturing process where transistors and an interconnect structure have been formed. In some embodiments, the wafer W1 can be interchangeably referred to as a substrate. As shown in FIGS. 9A and 9B, the TMD layer 602 is transferred to a wafer W1. The TMD layer 602 is mechanically or chemically exfoliated from the underlying crystalline substrate 600. Then, the TMD layer 602 is transferred onto an ILD layer 120 of the wafer W1.

In some embodiments, the semiconductor wafer W1 may comprise a substrate 102. The substrate 102 may comprise, for example, bulk silicon, doped or undoped, or an active layer of a SOI substrate. Generally, an SOI substrate comprises a layer of a semiconductor material, such as silicon, formed on an insulator layer. The insulator layer may be, for example, a buried oxide layer or a silicon oxide layer. The insulator layer is provided on a substrate, such as a silicon or glass substrate. Alternatively, the substrate 102 may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used.

In some embodiments, one or more active and/or passive devices 104 (illustrated in FIG. 9B as a single transistor) are formed on the substrate 102. The one or more active and/or passive devices 104 may include various N-type metal-oxide semiconductor and/or P-type metal-oxide semiconductor devices, such as transistors, capacitors, resistors, diodes, photo-diodes, fuses, and the like. One of ordinary skill in the art will appreciate that the above examples are provided for the purpose of illustration only and are not meant to limit the present disclosure in any manner. Other circuitry may be also formed as appropriate for a given application.

In some embodiments, an interconnect structure 106 is formed over the one or more active and/or passive devices 104 and the substrate 102. The interconnect structure 106 electrically interconnects the one or more active and/or passive devices 104 to form functional electrical circuits within the semiconductor structure 10. The interconnect structure 106 may comprise one or more metallization layers $108_1$ to $108_M$, wherein M is the number of the one or more metallization layers $108_1$ to $108_M$. In some embodiments, the value of M may vary according to design specifications of the semiconductor structure 10. In what follows, the one or more metallization layers $108_1$ to $108_M$ may also be collectively referred to as the one or more metallization layers 108. The metallization layers $108_1$ to $108_M$ comprise dielectric layers $110_1$ to $110_M$ and dielectric layers $111_1$ to $111_M$, respectively. The dielectric layers $111_1$ to $111_M$ are formed over the corresponding dielectric layers $110_1$ to $110_M$. The metallization layers $108_1$ to $108_M$ comprise one or more horizontal interconnects, such as conductive lines $114_1$ to $114_M$, respectively extending horizontally or laterally in dielectric layers $111_1$ to $111_M$ and vertical interconnects, such as conductive vias $116_1$ to $116_M$, respectively extending vertically in dielectric layers $110_1$ to $110_M$. Formation of the interconnect structure 106 can be referred to as a back-end-of-line (BEOL) process.

Contact plugs $112_0$ electrically couple the overlying interconnect structure 106 to the underlying devices 104. In the depicted embodiments, the devices 104 are fin field-effect transistors (FinFET) that are three-dimensional metal-oxide-semiconductor FET structure formed in fin-like strips of semiconductor protrusions 103 referred to as fins. The cross-section shown in FIG. 9B is taken along a longitudinal axis of the fin in a direction parallel to the direction of the current flow between the source/drain regions $104_{SD}$. The fin 103 may be formed by patterning the substrate 102 using photolithography and etching techniques. For example, a spacer image transfer patterning technique may be used. In this method a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 103 by etching a trench into the substrate 102 using, for example, reactive ion etching. FIGS. 9A and 9B illustrate a single fin 103, although the substrate 102 may comprise any number of fins. In some other embodiments, the devices 104 are planar transistors or gate-all-around transistors.

Shallow trench isolation (STI) regions 105 formed on opposing sidewalls of the fin 103 are illustrated in FIG. 9B. STI regions 105 may be formed by depositing one or more dielectric materials (e.g., silicon oxide) to completely fill the trenches around the fins and then recessing the top surface of the dielectric materials. The dielectric materials of the STI regions 105 may be deposited using a high density plasma CVD, low-pressure CVD, sub-atmospheric CVD (SACVD), a flowable CVD (FCVD), spin-on, and/or the like, or a combination thereof. After the deposition, an anneal process or a curing process may be performed. In some cases, the STI regions 105 may include a liner such as, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 105 such that an upper portion of fins 103 protrudes from surrounding insulating STI regions 105. In some cases, the patterned hard mask used to form the fins 103 may also be removed by the planarization process.

In some embodiments, a gate structure $104_G$ of the Fin-FET device 104 illustrated in FIG. 9B is a high-k, metal gate (HKMG) structure that may be formed using a gate-last process flow. In a gate-last process flow a sacrificial dummy gate structure (not shown) is formed after forming the STI regions 105. The dummy gate structure may comprise a dummy gate dielectric, a dummy gate electrode, and a hard mask. First a dummy gate dielectric material (e.g., silicon oxide, silicon nitride, or the like) may be deposited. Next a dummy gate material (e.g., amorphous silicon, polycrystalline silicon, or the like) may be deposited over the dummy gate dielectric and then planarized (e.g., by CMP). A hard mask layer (e.g., silicon nitride, silicon carbide, or the like) may be formed over the dummy gate material. The dummy gate structure is then formed by patterning the hard mask and transferring that pattern to the dummy gate dielectric and dummy gate material using suitable photolithography and etching techniques. The dummy gate structure may extend along multiple sides of the protruding fins and extend between the fins over the surface of the STI regions 105. As described in greater detail below, the dummy gate structure may be replaced by the HKMG gate structure $104_G$ as illustrated in FIG. 9B. The materials used to form the dummy gate structure and hard mask may be deposited using any suitable method such as CVD, PECVD, atomic layer deposition (ALD), plasma-enhanced ALD (PEALD) or the like, or by thermal oxidation of the semiconductor surface, or combinations thereof.

In FIG. 9B, source/drain regions $104_{SD}$ and spacers $104_{SP}$ of the transistor 104 are formed, for example, self-aligned to the dummy gate structures. Spacers $104_{SP}$ may be formed by deposition and anisotropic etch of a spacer dielectric layer performed after the dummy gate patterning is complete. The spacer dielectric layer may include one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers $104_{SP}$ along the sidewalls of the dummy gate structures extending laterally onto a portion of the surface of the fin 103.

Source/drain regions $104_{SD}$ are semiconductor regions in direct contact with the semiconductor fin 103. In some embodiments, the source/drain regions $104_{SD}$ may comprise heavily-doped regions and relatively lightly-doped drain extensions, or LDD regions. Generally, the heavily-doped regions are spaced away from the dummy gate structures using the spacers $104_{SP}$, whereas the LDD regions may be formed prior to forming spacers $104_{SP}$ and, hence, extend under the spacers $104_{SP}$ and, in some embodiments, extend further into a portion of the semiconductor fin 103 below the dummy gate structure. The LDD regions may be formed, for example, by implanting dopants (e.g., As, P, B, In, or the like) using an ion implantation process.

The source/drain regions $104_{SP}$ may comprise an epitaxially grown region. For example, after forming the LDD regions, the spacers $104_{SP}$ may be formed and, subsequently, the heavily-doped source and drain regions may be formed self-aligned to the spacers $104_{SP}$ by first etching the fins to form recesses, and then depositing a crystalline semiconductor material in the recess by a selective epitaxial growth (SEG) process that may fill the recess and may extend further beyond the original surface of the fin 103 to form raised source/drain epitaxy structures. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method, such as e.g., vapor/solid/liquid phase epitaxy, or metal-organic CVD, or molecular beam epitaxy, or the like. A high dose (e.g., from about 1014 cm-2 to 1016 $cm^{-2}$) of dopants may be introduced into the heavily-doped source and drain regions $104_{SD}$ either in situ during SEG, or by an ion implantation process performed after the SEG, or by a combination thereof.

Once the source/drain regions $104_{SD}$ are formed, a first ILD layer (e.g., lower portion of the ILD layer $110_0$) is deposited over the source/drain regions $104_{SD}$. In some embodiments, a contact etch stop layer (not shown) of a suitable dielectric (e.g., silicon nitride, silicon carbide, or the like, or a combination thereof) may be deposited prior to depositing the ILD material. A planarization process (e.g., CMP) may be performed to remove excess ILD material and any remaining hard mask material from over the dummy gates to form a top surface wherein the top surface of the dummy gate material is exposed and may be substantially coplanar with the top surface of the first ILD layer. The HKMG gate structures $104_G$, illustrated in FIG. 9B, may then be formed by first removing the dummy gate structures using one or more etching techniques, thereby creating recesses between respective spacers $104_{SP}$. Next, a replacement gate dielectric layer $104_{GD}$ comprising one more dielectrics, followed by a replacement gate metal layer $104_{GM}$ comprising one or more metals, are deposited to completely fill the recesses. Excess portions of the gate structure layers $104_{GD}$ and $104_{GM}$ may be removed from over the top surface of first ILD using, for example, a CMP process. The resulting structure, as illustrated in FIG. 9B, may include remaining portions of the HKMG gate layers $104_{GD}$ and $104_{GM}$ inlaid between respective spacers $104_{SP}$.

The gate dielectric layer $104_{GD}$ includes, for example, a high-k dielectric material such as oxides and/or silicates of metals (e.g., oxides and/or silicates of Hf, Al, Zr, La, Mg. Ba, Ti, and other metals), silicon nitride, silicon oxide, and the like, or combinations thereof, or multilayers thereof. In some embodiments, the gate metal layer $104_{GM}$ may be a multilayered metal gate stack comprising a barrier layer, a work function layer, and a gate-fill layer formed successively on top of gate dielectric layer $104_{GD}$. Example materials for a barrier layer include TiN, TaN, Ti, Ta, or the like, or a multilayered combination thereof. A work function layer may include TiN, TaN, Ru, Mo, Al, for a p-type FET, and Ti, Ag, TaAl, TaAlC, TiAlN, TaC, TaCN, TaSiN, Mn, Zr, for an n-type FET. Other suitable work function materials, or combinations, or multilayers thereof may be used. The gate-fill layer which fills the remainder of the recess may comprise metals such as Cu, Al, W, Co, Ru, or the like, or combinations thereof, or multi-layers thereof. The materials used in forming the gate structure may be deposited by any suitable method, e.g., CVD, PECVD, physical vapor deposition (PVD), ALD, PEALD, electrochemical plating (ECP), electroless plating and/or the like.

After forming the HKMG structure $104_G$, a second ILD layer is deposited over the first ILD layer, and these ILD layers are in combination referred to as the ILD layer $110_0$, as illustrated in FIG. 9B. In some embodiments, the insulating materials to form the first ILD layer and the second ILD layer may comprise silicon oxide, phosphosilicate glass (PSG), borosilicate glass, boron-doped PSG (BPSG), undoped silicate glass, a low dielectric constant (low-k) dielectric such as, fluorosilicate glass (FSG), silicon oxycarbide, carbon-doped oxide, flowable oxide, or porous oxides (e.g., xerogels/aerogels), or the like, or a combination thereof. The dielectric materials used to form the first ILD layer and the second ILD layer may be deposited using any suitable method, such as CVD, PVD. ALD, PEALD, PECVD, SACVD, FCVD, spin-on, and/or the like, or a combination thereof.

As illustrated in FIG. 9B, electrodes of electronic devices formed in the substrate 102 may be electrically connected to conductive lines $114_1$ to $114_M$ and the conductive vias $116_1$ to $116_M$ using contacts $112_0$ formed through the intervening dielectric layers. In the example illustrated in FIG. 9B, the contacts $112_0$ make electrical connections to the gate structure $104_G$ and the source/drain regions $104_{SP}$ of FinFET 104. The contacts $112_0$ may be formed using photolithography, etching and deposition techniques.

For example, a patterned mask may be formed over the ILD layer $110_0$ and used to etch openings that extend through the ILD layer $110_0$ to expose the gate structure $104_G$ as well as the source/drain regions $104_{SD}$. Thereafter, conductive liner may be formed in the openings in the ILD layer $110_0$. Subsequently, the openings are filled with a conductive fill material. The liner comprises barrier metals used to reduce out-diffusion of conductive materials from the contacts $112_0$ into the surrounding dielectric materials. In some embodiments, the liner may comprise two barrier metal layers. The first barrier metal comes in contact with the semiconductor material in the source/drain regions $104_{SD}$ and may be subsequently chemically reacted with the heavily-doped semiconductor in the source/drain regions $104_{SD}$ to form a low resistance ohmic contact, after which the unreacted metal may be removed. For example, if the heavily-doped semiconductor in the source/drain regions $104_{SD}$ is silicon or silicon-germanium alloy semiconductor, the first barrier metal may comprise Ti, Ni, Pt, Co, other suitable metals, or their alloys, and may form silicide with the source/drain regions $104_{SD}$. The second barrier metal layer of the conductive liner may additionally include other metals (e.g., TIN, TaN, Ta, or other suitable metals, or their alloys). A conductive fill material (e.g., W. Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof). Next, a planarization process (e.g., CMP) may be used to remove excess portions of all the conductive materials from over the surface of the ILD $110_0$. The resulting conductive plugs extend into the ILD layer $110_0$ and constitute contacts $112_0$ making physical and electrical connections to the electrodes of electronic devices, such as the tri-gate FinFET 104 illustrated in FIG. 9B.

After forming the contacts $112_0$, the interconnect structure 106 including multiple interconnect levels may be formed, stacked vertically above the contact plugs $112_0$ formed in the ILD layer $110_0$, in accordance with a BEOL scheme adopted for the IC design. In the BEOL scheme illustrated in FIG. 9B, various interconnect levels have similar features. However, it is understood that other embodiments may utilize alternate integration schemes wherein the various interconnect levels may use different features. For example, the source/drain contacts $112_0$, which are shown as vertical connectors, may be extended to form conductive lines which transport current laterally.

The multiple interconnect levels include, for example, the conductive lines $114_1$ to $114_M$ and the conductive vias $116_1$ to $116_M$ that may be formed in the respective inter-metal dielectric (IMD) layers $110_1$ to $110_M$ and $111_1$ to $111_M$ using any suitable method, such as a single damascene process, a dual damascene process, or the like. In some embodiments, the IMD layers $110_1$ to $110_M$ and $111_1$ to $111_M$ may include low-k dielectric materials having k values, for example, lower than about 4.0 or even 2.0 disposed between such conductive features. In some embodiments, the IMD layers may be made of, for example, PSG, BPSG, FSG, SiOxCy, Spin-On-Glass, Spin-On-Polymers, silicon oxide, silicon oxynitride, combinations thereof, or the like, formed by any suitable method, such as spin-on coating, CVD, PECVD, or the like. The conductive lines $114_1$ to $114_M$ and the conductive vias $116_1$ to $116_M$ may comprise conductive materials such as copper, aluminum, tungsten, combinations thereof, or the like. In some embodiments, the conductive lines $114_1$ to $114_M$, and the conductive vias $116_1$ to $116_M$ may further comprise one or more barrier/adhesion layers (not shown) to protect the respective IMD layers $110_1$ to $110_M$ and $111_1$ to $111_M$ from metal diffusion (e.g., copper diffusion) and metallic poisoning. The one or more barrier/adhesion layers may comprise titanium, titanium nitride, tantalum, tantalum nitride, or the like, and may be formed using PVD, CVD, ALD, or the like.

An additional ILD layer 120 is formed over the metallization layer $108_M$ of interconnect structure 106 using, for example, PVD, CVD. ALD or the like. The ILD layer 120 serves as a substrate supporting 2D semiconductor materials, which will be discussed in greater detail below. Therefore, the ILD layer 120 plays a different role than the underlying IMD layers $110_1$ to $110_M$ and $111_1$ to $111_M$ and ILD layer $110_0$, and thus may have a different thickness and/or material than the IMD layers $110_1$ to $110_M$ and $111_1$ to $111_M$ and ILD layer $110_0$. For example, the ILD layer 120 may be thinner or thicker than one or more of the IMD layers $110_1$ to $110_M$ and $111_1$ to $111_M$ and ILD layer $110_0$. Alternatively, the ILD layer 120 may have a same thickness and/or material as one or more of the IMD layers $110_1$ to $110_M$ and $111_1$ to $111_M$ and ILD layer $110_0$.

In some embodiments, the ILD layer 120 may include low-k dielectric materials having k values, for example, lower than about 4.0 or even 2.0. For example, the ILD layer 120 may be made of, for example, PSG, BPSG, FSG, SiOxCy, Spin-On-Glass, Spin-On-Polymers, silicon oxide, silicon oxynitride, combinations thereof, or the like, formed by any suitable method, such as spin-on coating, CVD, PECVD, or the like.

Figure 9C:
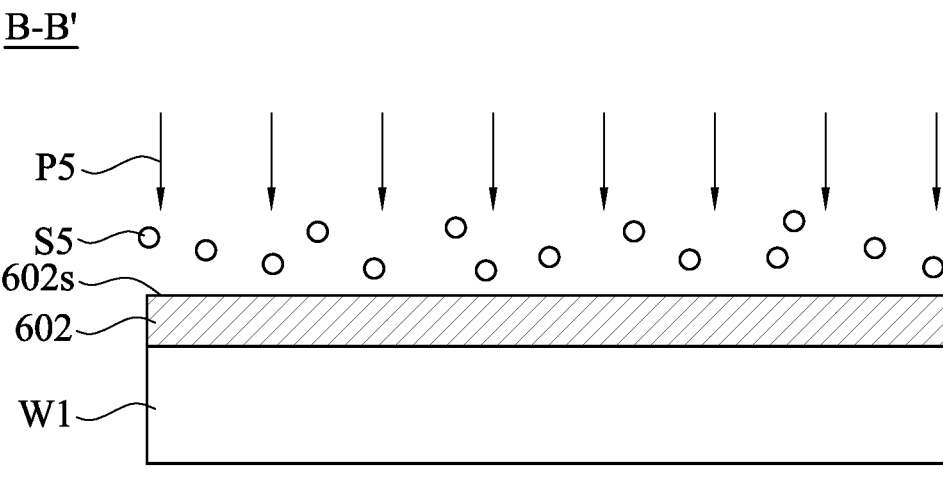
Figure 9D:
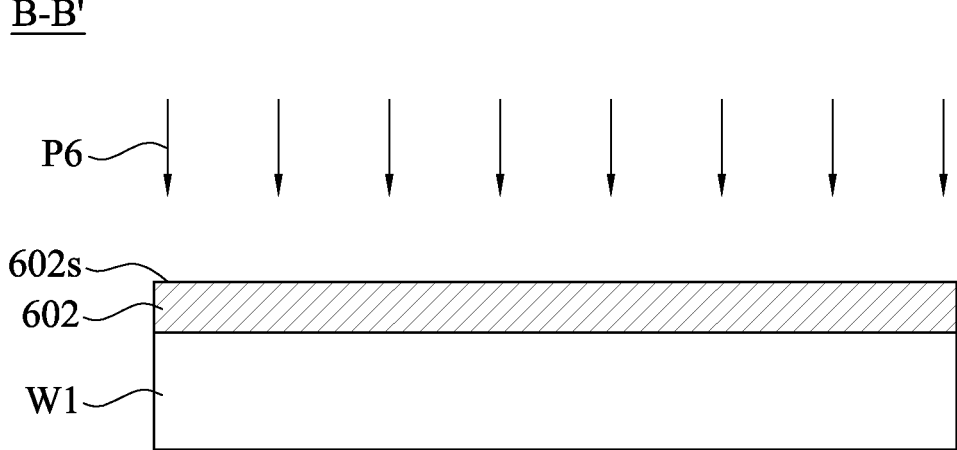

Reference is made to FIGS. 9C and 9D. After the TMD layer 602 is transferred to the wafer W1, an IBA method includes an ion bombardment process P5 and an annealing process P6 can be performed on the transferred TMD layer 602 to further decrease surface defects on the TMD layer 602. In some embodiments, the IBA method shown in FIGS. 9C and 9D is performed while the IBA method shown in FIGS. 7 and 8 is omitted. In some embodiments, the ion bombardment process P3 shown in FIG. 7 and the annealing process P6 shown in FIG. 9D are performed as an IBA method while the annealing process P4 shown in FIG. 7 and the ion bombardment process P5 shown in FIG. 9C are omitted.

As shown in FIG. 9C, the ion bombardment process P5 is performed on the transferred TMD layer 602. After the transferred TMD layer 602 is bombarded, the surface 602s of the TMD layer 602 becomes rough with nanogranule and forms ion-bombarded damagements, such as holes, clusters, and/or other defects, thereof, and the surface crystallinity of the transferred TMD layer 602 can be attenuated. The ion-bombarded damagement can destroy the bonds around the crystalline defect and have a greater dimension than the crystalline defect. In some embodiments, after the ion bombardment process P5, the surface 602s of the transferred TMD layer 602 may be formed by amorphous crystals or polycrystals, or grain regions. In some embodiments, the ion bombardment process P5 can use an ion source S5 including inert gas having atomic weight less than about 50, such as He, Ne, Ar, in a plasma state. In some embodiments, the ion source S5 used in the ion bombardment process P5 may include positively (e.g. Ar+) or negatively charged ions. In some embodiments, the ion bombardment process P5 can have an ion bombardment energy in a range from about 0.1 keV to about 2.0 keV, such as about 0.1, 0.5, 1, 1.5, or 2 keV. In some embodiments, the ion bombardment process P5 can have a process time duration in a range from about 1 to about 30 minutes, such as about 1, 3, 5, 10, 15, 20, 25, or 30 minutes. In some embodiments, the ion bombardment process P5 can be performed under a pressure lower than about $1 \times 10^{-5}$ Torr.

Reference is made to FIG. 9D. After the ion bombardment process P5, the annealing process P6 is performed on the transferred TMD layer 602. The annealing process P6 initiates recrystallization or restoration of the long-range ordering on the TMD layer 602. The transferred TMD layer 602 with the ion-bombarded damagements can be healed by the annealing process P6. In this stage, some chalcogen atoms and transition metal atoms diffuse to recrystallize the surface 602s of the transferred TMD layer 602. The outermost surface of the transferred TMD layer 602 can be first crystallized, which warrants no crystalline defect (e.g., chalcogen vacancy) at the surface 602s of the TMD layer 602 when the whole sample is nearly recrystallized. If a few vacancies remained at the surface 602s of the TMD layer 602 in this stage instead of turning into the ion-bombarded damagements, they would be hardly removed simply by the low temperature or even by further elevating the temperature. Subsequently, some vacancies could be buried underneath, and some atoms could remain atop the surface 602s as shown in FIG. 21. These vacancies could diffuse toward the interior of the transferred TMD layer 602 and/or the edge of the transferred TMD layer 602, or be amended by migrating adatoms through a chain process.

After the annealing process P6 is complete, the surface 602s of the transferred TMD layer 602 can be perfectly restored, with nearly no surface defects, the density of surface defects can be less than about $1.0 \times 10^{10}$ cm$^{-2}$ (counts by areas>about 10000 nm$^2$), by way of example but not limiting the present disclosure. In some embodiments, the annealing process P6 can be performed at a temperature in a range from about 100° C. to about 600° C., such as about 100, 200, 300, 400, 500, or 600° C. In some embodiments, the temperature of the annealing process P6 can be ramped up or directly set to the recrystallization temperature. In some embodiments, the annealing process P6 is performed under a pressure lower than about $1 \times 10^{-5}$ Torr. In some embodiments, a precursor can be introduced on transferred the TMD layer 602 during the annealing process P6 to form a precursor-rich ambient around the TMD layer 602, and the precursor may include chalcogen element (e.g., Te, Se, or S) that is the same as chalcogen atom in the TMD layer 602.

In some embodiments, the ion bombardment process P5 and the annealing process P6 in the IBA method may be performed sequentially or simultaneously. In some embodiments, the ion bombardment process P5 and the annealing process P6 in the IBA method may be performed in-situ or ex-situ. In some embodiments, the IBA method can be a cyclic process including at least one repetition of an ion bombardment process and an annealing process. For example, it may perform an ion bombardment process P5 (e.g., FIG. 9C) followed by an annealing process P6 (e.g., FIG. 9D), and repeats the ion bombardment process P5 and the annealing process P6.

Figure 10A:
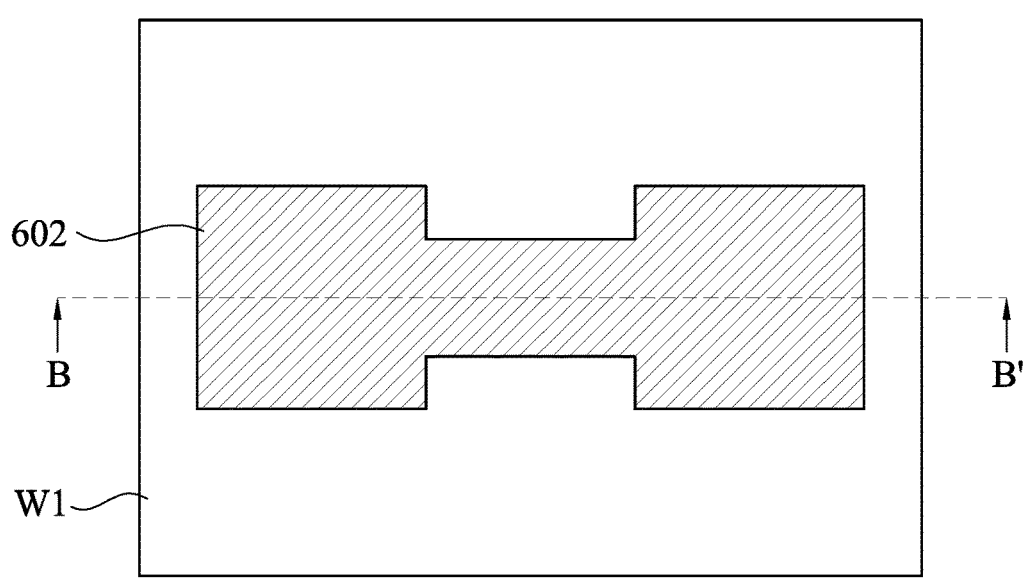
Figure 10B:
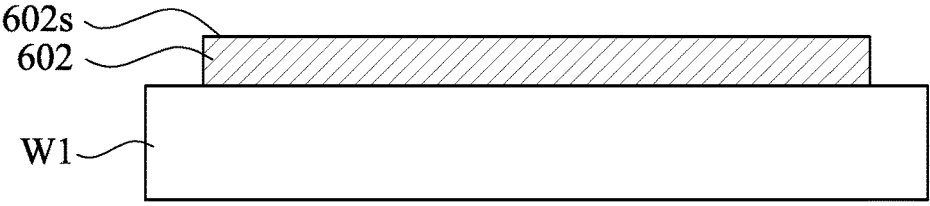

Reference is made to FIGS. 10A and 10B. FIG. 10A illustrates a top view of an intermediate structure of the wafer W1 with the TMD layer 602 in an IC manufacturing process in accordance with some embodiments of the present disclosure. FIG. 10B is a cross-sectional view along line B-B' of FIG. 10A. As shown in FIGS. 10A and 10B, the TMD layer 602 is patterned. In some embodiments, the patterning process includes a photolithography process and an etching process to remove portions of the TMD layer 602 on the wafer W1.

Figure 10C:
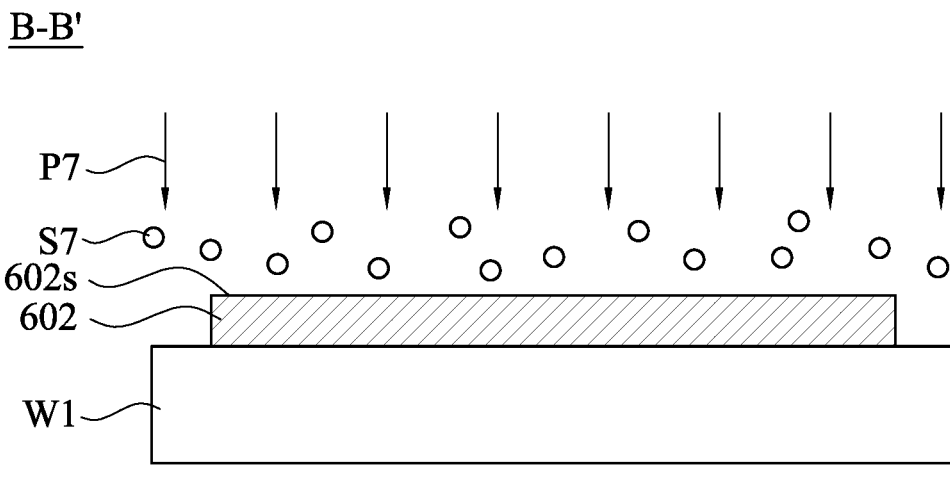
Figure 10D:
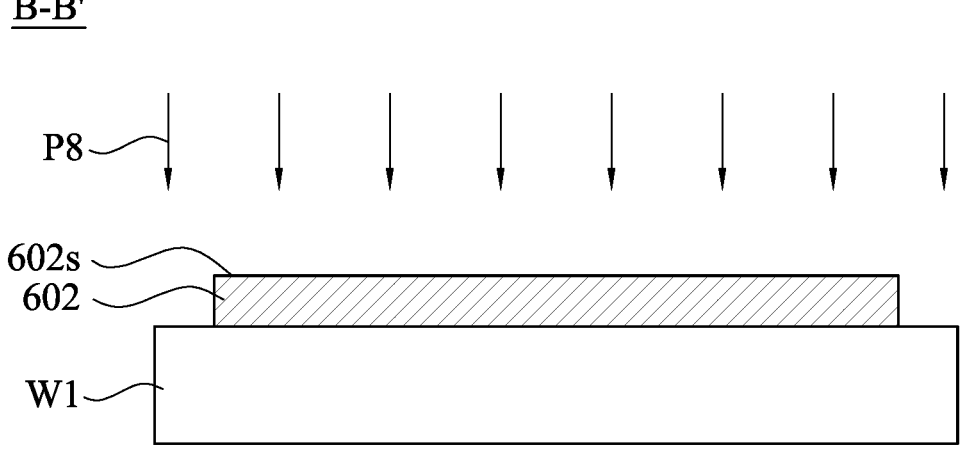

Reference is made to FIGS. 10C and 10D. After the TMD layer 602 is patterned, an IBA method includes an ion bombardment process P7 and an annealing process P8 can be performed on the patterned TMD layer 602 to further decrease surface defects on the TMD layer 602. In some embodiments, the IBA method shown in FIGS. 10C and 10D is performed while at least one of the IBA methods shown in FIGS. 7, 8, 9C, and 9D is omitted. As shown in FIG. 10C, the ion bombardment process P7 is performed on the patterned TMD layer 602. After the patterned TMD layer 602 is bombarded, the surface 602$s$ of the TMD layer 602 becomes rough with nanogranule and forms ion-bombarded damagements, such as holes, clusters, and/or other defects, thereof, and the surface crystallinity of the patterned TMD layer 602 can be attenuated. The ion-bombarded damagement can destroy the bonds around the crystalline defect and have a greater dimension than the crystalline defect. In some embodiments, after the ion bombardment process P7, the surface 602$s$ of the patterned TMD layer 602 may be formed by amorphous crystals or polycrystals, or grain regions. In some embodiments, the ion bombardment process P7 can use an ion source S7 including inert gas having atomic weight less than about 50, such as He, Ne, Ar, in a plasma state. In some embodiments, the ion source S7 used in the ion bombardment process P7 may include positively (e.g. Ar$^+$) or negatively charged ions. In some embodiments, the ion bombardment process P7 can have an ion bombardment energy in a range from about 0.1 keV to about 2.0 keV, such as about 0.1, 0.5, 1, 1.5, or 2 keV. In some embodiments, the ion bombardment process P7 can have a process time duration in a range from about 1 to about 30 minutes, such as about 1, 3, 5, 10, 15, 20, 25, or 30 minutes. In some embodiments, the ion bombardment process P7 can be performed under a pressure lower than about $1 \times 10^{-5}$ Torr.

Reference is made to FIG. 10D. After the ion bombardment process P7, the annealing process P8 is performed on the patterned TMD layer 602. The annealing process P8 initiates recrystallization or restoration of the long-range ordering on the TMD layer 602. The patterned TMD layer 602 with the ion-bombarded damagements can be healed by the annealing process P8. In this stage, some chalcogen atoms and transition metal atoms diffuse to recrystallize the surface 602$s$ of the patterned TMD layer 602. The outermost surface of the patterned TMD layer 602 can be first crystallized, which warrants no crystalline defect (e.g., chalcogen vacancy) at the surface 602$s$ of the patterned TMD layer 602 when the whole sample is nearly recrystallized. If a few vacancies remained at the surface 602$s$ of the TMD layer 602 in this stage instead of turning into the ion-bombarded damagements, they would be hardly removed simply by the low temperature or even by further elevating the temperature. Subsequently, some vacancies could be buried underneath, and some atoms could remain atop the surface 602$s$ as shown in FIG. 21. These vacancies could diffuse toward the interior of the patterned TMD layer 602 and/or the edge of the patterned TMD layer 602, or be amended by migrating adatoms through a chain process.

After the annealing process P8 is complete, the surface 602$s$ of the patterned TMD layer 602 can be perfectly restored, with nearly no surface defects, the density of surface defects can be less than about $1.0 \times 10^{10}$ cm$^{-2}$ (counts by areas>about 10000 nm$^2$), by way of example but not limiting the present disclosure. In some embodiments, the annealing process P8 can be performed at a temperature in a range from about 100° C. to about 600° C., such as about 100, 200, 300, 400, 500, or 600° C. In some embodiments, the temperature of the annealing process P8 can be ramped up or directly set to the recrystallization temperature. In some embodiments, the annealing process P8 is performed under a pressure lower than about $1 \times 10^{-5}$ Torr. In some embodiments, a precursor can be introduced on the patterned TMD layer 602 during the annealing process P8 to form a precursor-rich ambient around the TMD layer 602, and the precursor may include chalcogen element (e.g., Te, Se, or S) that is the same as chalcogen atom in the TMD layer 602.

In some embodiments, the ion bombardment process P7 and the annealing process P8 in the IBA method may be performed sequentially or simultaneously. In some embodiments, the ion bombardment process P7 and the annealing process P8 in the IBA method may be performed in-situ or ex-situ. In some embodiments, the IBA method can be a cyclic process including at least one repetition of an ion bombardment process and an annealing process. For example, it may perform an ion bombardment process P7 (e.g., FIG. 10C) followed by an annealing process P8 (e.g., FIG. 10D), and repeats the ion bombardment process P7 and the annealing process P8.

Figure 11A:
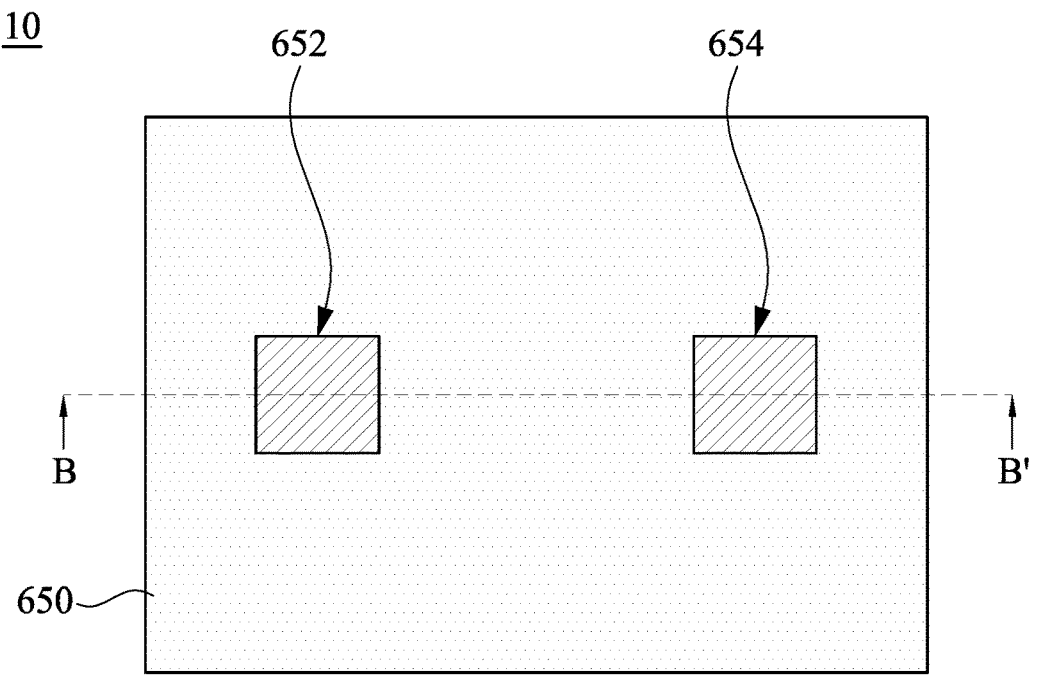
Figure 11B:
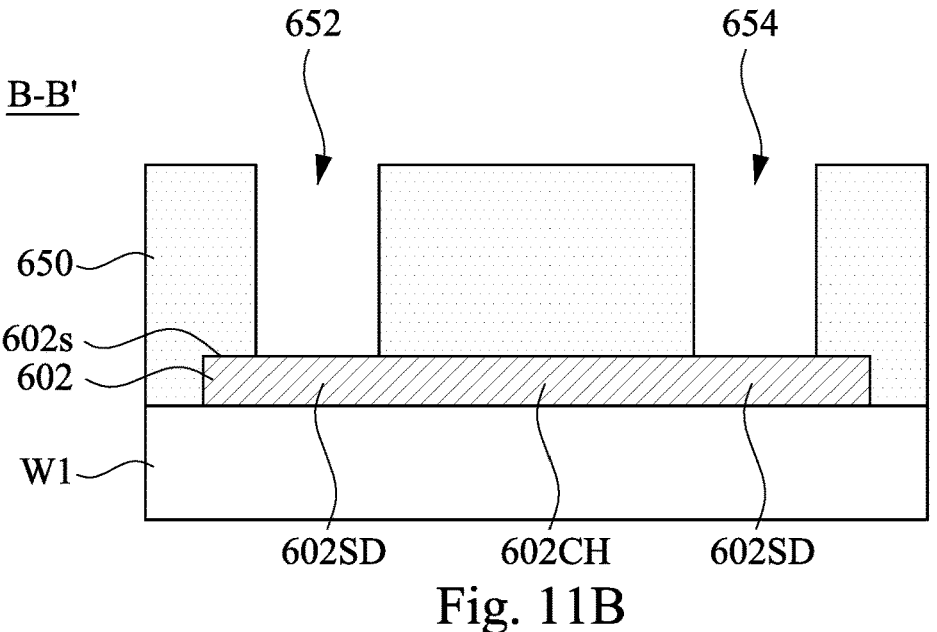

Reference is made to FIGS. 11A and 11B. FIG. 11A illustrates a top view of an intermediate structure of the wafer W1 with the TMD layer 602 in an IC manufacturing process in accordance with some embodiments of the present disclosure. FIG. 11B is a cross-sectional view along line B-B' of FIG. 11A. As shown in FIGS. 11A and 11B, a mask layer 650 is formed over the wafer W1 and the TMD layer 602. In some embodiments, the mask layer 650 is patterned to form openings 652 and 654 exposing portions of the top surface 602$s$ of the TMD layer 602. In some embodiments, the mask layer 650 may include a photoresist material. In some embodiments, portions of the TMD layer 602 exposed by the openings 652 and 654 can be referred to as source/drain regions 602SD, and a portion of the TMD layer 602 between the source/drain regions 602SD can be referred to as channel region 602CH.

In some embodiments, the mask layer 650 can be formed by depositing a photoresist layer over the wafer W1 by suitable process, such as spin-coating technique, which may include baking the photoresist layer after coating. The photoresist layer may include positive-type or negative-type resist materials. For example, the photoresist layer include poly(methylmethacrylate) (PMMA). Then, the photoresist layer is subjected to an exposure process. For example, the photoresist layer is exposed to radiation energy, such as ultraviolet radiation, through a mask (photomask or reticle) having a predefined pattern (e.g., pattern that defines the positions of the openings 652 and 654), resulting in a photoresist pattern that includes exposed regions of the photoresist layer. The radiation energy may use krypton fluoride (KrF) excimer laser or argon fluoride (ArF) excimer laser. Thereafter, the photoresist layer may be subjected to a post-exposure bake (PEB) process. Afterward, the photoresist layer is developed by a suitable process. For example, the photoresist layer is exposed to a developing solution, such as tetramethylammonium hydroxide, to remove portions of the photoresist layer to form the openings 652 and 654 that expose the top surface 602s of the TMD layer 602. Thereafter, a rinsing process, such as a de-ionized water rinse, may be performed. The patterned photoresist layer is referred to the mask layer 650.

Figure 12A:
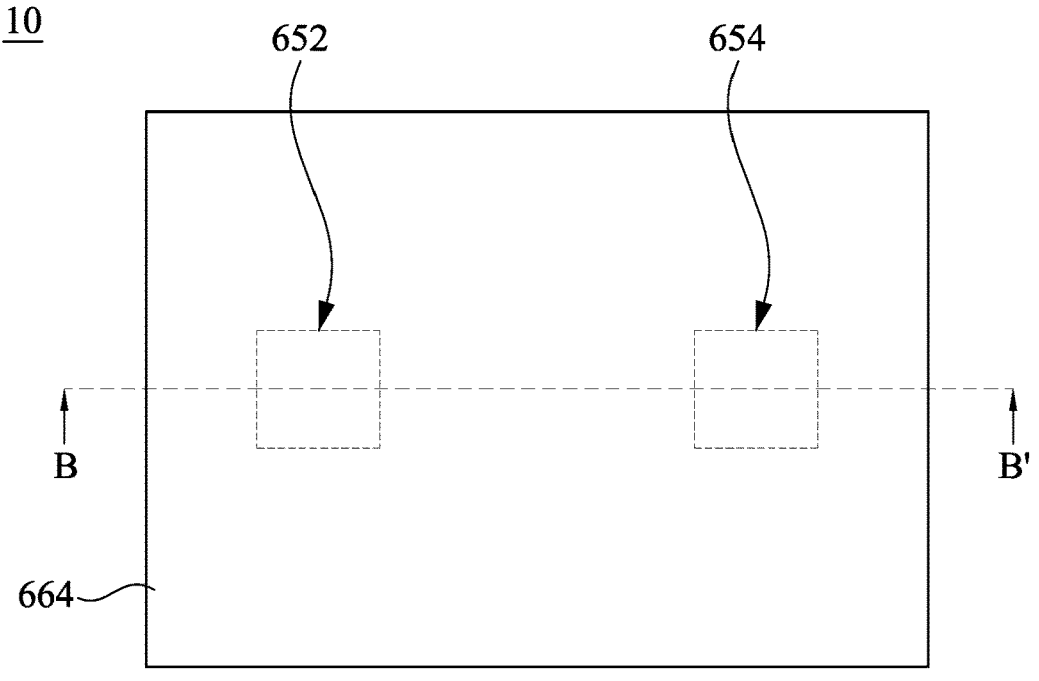
Figure 12B:
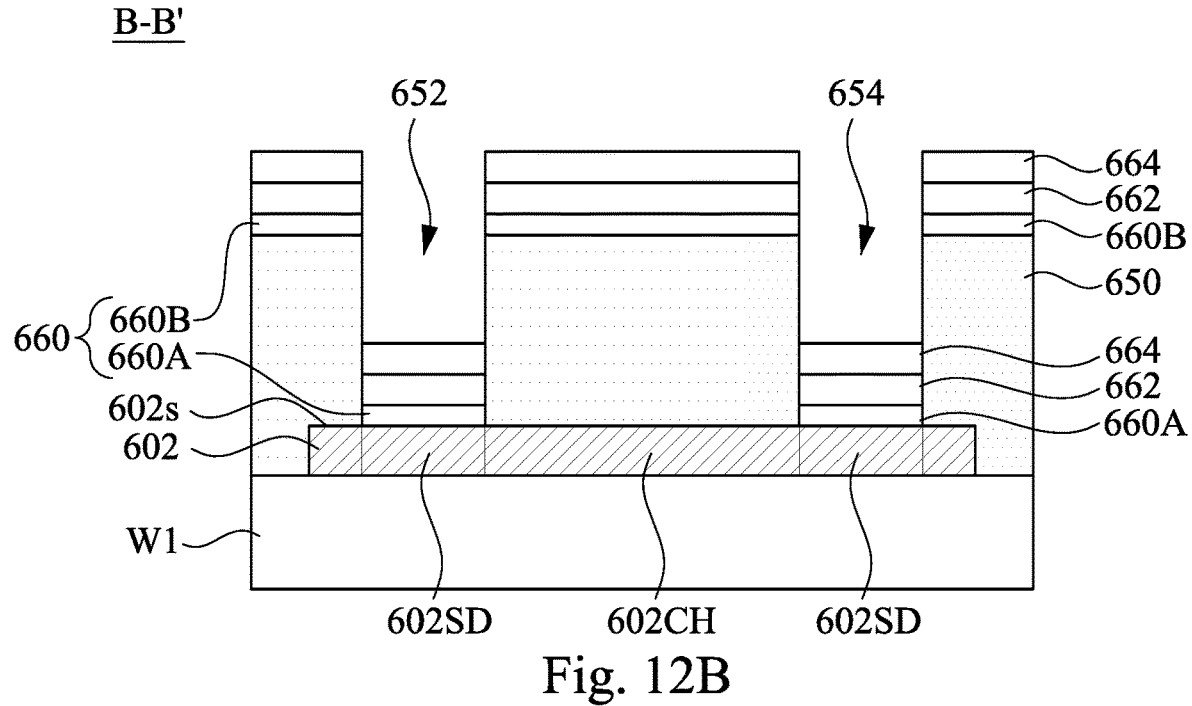

Reference is made to FIGS. 12A and 12B. FIG. 12A illustrates a top view of an intermediate structure of the wafer W1 with the TMD layer 602 in an IC manufacturing process in accordance with some embodiments of the present disclosure. FIG. 12B is a cross-sectional view along line B-B' of FIG. 12A. As shown in FIGS. 12A and 12B, a contact layer 660, a separation metal layer 662, and an electrode metal layer 664 are sequentially formed in the openings 652 and 654. On the other hand, the contact layer 660, the separation metal layer 662, and the electrode metal layer 664 are formed over a top surface of the mask layer 650.

In some embodiments, the contact layer 660 includes a first portion 660A disposed in the openings 652 and 654 and extends along the source/drain regions 602SD of the TMD layer 602, and a second portion 660B disposed on and extends along the top surface of the mask layer 650. In some embodiments, the first portion 660A and the second portion 660B are made of the same material, while the first portion 660A and the second portion 660B have different crystalline structures. For example, the first portion 660A of the contact layer 660 has a 2-D crystalline structure, and the second portion 660B of the contact layer 660 has a 3-D crystalline structure. In some embodiments, the first portion 660A of the contact layer 660 can also be referred to as second 2-D material layer. In some embodiments, the first portion 660A of the contact layer 660 is thinner than the separation metal layer 662 and the electrode metal layer 664. In some embodiments, the first portion 660A of the contact layer 660 is thinner than the TMD layer 602. Here, the term "3-D crystalline structure" indicates a structure has regular arrangements of atoms in three dimensions represented by a repeated unit cell, in which the unit cell is the smallest three dimensions repeating unit showing the full symmetry of the crystalline structure. On the other hand, a "2-D material" indicates a structure has regular arrangements of atoms in two dimensions.

In some embodiments, the first portion 660A of the contact layer 660 includes group-IV materials, such as germanium (Ge), tin (Sn), plumbum (Pb), etc. In some embodiments, the first portion 660A of the contact layer 660 behaves like topological insulators with possible room-temperature superconducting properties at the edges thereof. A topological insulator behaves like an insulator in its interior while exhibiting conductive properties at the boundary portions thereof (e.g., the surfaces of a bulk or edges of a film), meaning that charge carriers can only move along the boundary portion of the material. Particularly, it has been shown that 2-D tin (stanene) behaves like a topological insulator with possible room-temperature superconducting properties at the edges of the stanene ribbons, which makes the first portion 660A of the contact layer 660 a candidate of source/drain contact material (interchangeably referred to as conductive 2-D material layer in this context). In some embodiments, the TMD layer 602 and the first portion 660A of the contact layer 660 have different materials. For example, the TMD layer 602 may be MoS$_2$, and the first portion 660A of the contact layer 660 may be stanene, germanene, or other 2-D materials including group-IV elements.

On the other hand, because the mask layer 650 is formed of polymer materials, such as PMMA, which is not a 2-D material layer. Therefore, the second portion 660B of the contact layer 660 tends to be formed in a 3-D crystalline structure on the mask layer 650. In some embodiments, the second portion 660B includes group-IV materials, such as germanium (Ge), tin (Sn), plumbum (Pb), etc.

In some embodiments, the separation metal layer 662 is used to separate the first portion 660A of the contact layer 660 from the electrode metal layer 664, such that the electrode metal layer 664 would not contact the first portion 660A of the contact layer 660. In some embodiments where the separation metal layer 662 is omitted, the first portion 660A of the contact layer 660 would extend along the electrode metal layer 664. However, the electrode metal layer 664 may form alloy with the first portion 660A of the contact layer 660 during deposition of the electrode metal layer 664, which might deteriorate the 2-D crystal structure of the first portion 660A of the contact layer 660. Without 2-D crystal structure, the contact resistance might be increased to an unsatisfactory value. Accordingly, the material of the separation metal layer 662 is selected such that the material would not form an alloy with the first portion 660A of the contact layer 660. In some embodiments, the separation metal layer 662 may include metal such as aluminum (Al), bismuth (Bi), cadmium (Cd), chromium (Cr), iridium (Ir), niobium (Nb), tantalum (Ta), tellurium (Te), tungsten (W), or other suitable metal. The above mentioned metal would not form an alloy with the first portion 660A of the contact layer 660 during deposition of the separation metal layer 662.

In some embodiments, the electrode metal layer 664 may be formed of suitable electrically conductive material, including polysilicon, graphene, and metal including one or more layers of aluminum (Al), copper (Cu), titanium (Ti), tantalum (Ta), tungsten (W), cobalt (Co), molybdenum (Mo), nickel (Ni), manganese (Mg), silver (Ag), palladium (Pd), rhenium (Rc), iridium (Ir), ruthenium (Ru), platinum (Pt), zirconium (Zr), tantalum nitride (TaN), nickel silicide (NiSi), cobalt silicide (CoSi), TiN, WN, TiAl, TiAlN, TaCN, TaC. TaSiN, metal alloys, other suitable materials, and/or combinations thereof. In some other embodiments, the electrode metal layer 664 may include material that may form alloy with the material of the first portion 660A of the contact layer 660, such as indium (In), plumbum (Pb), copper (Cu), silver (Ag), gold (Au), nickel (Ni), platinum (Pt), cobalt (Co), rhodium (Rh), ferrum (Fe), ruthenium (Ru), manganese (Mn), molybdenum (Mo), Vanadium (V), titanium (Ti), zirconium (Zr), hafnium (Hf), Magnesium (Mg). In some embodiments, the electrode metal layer 664 can be referred to as source/drain contact.

In some embodiments, the separation metal layer 662 and the electrode metal layer 664 can be formed by suitable process, such as multiple-chamber PVD system. In other embodiments, low temperature sputtering can be used to form the separation metal layer 662 and the electrode metal layer 664. In some embodiments, the mask layer 650 is substantially thicker than the stacked layers of the first portion 660A of the contact layer 660, the separation metal layer 662, and the electrode metal layer 664, so that the stacked layers of first portion 660A of the contact layer 660, the separation metal layer 662, and the electrode metal layer 664 in the openings 652 and 654 can be separated from the separation metal layer 662 and the electrode metal layer 664 over the top surface of the mask layer 650.

Figure 13A:
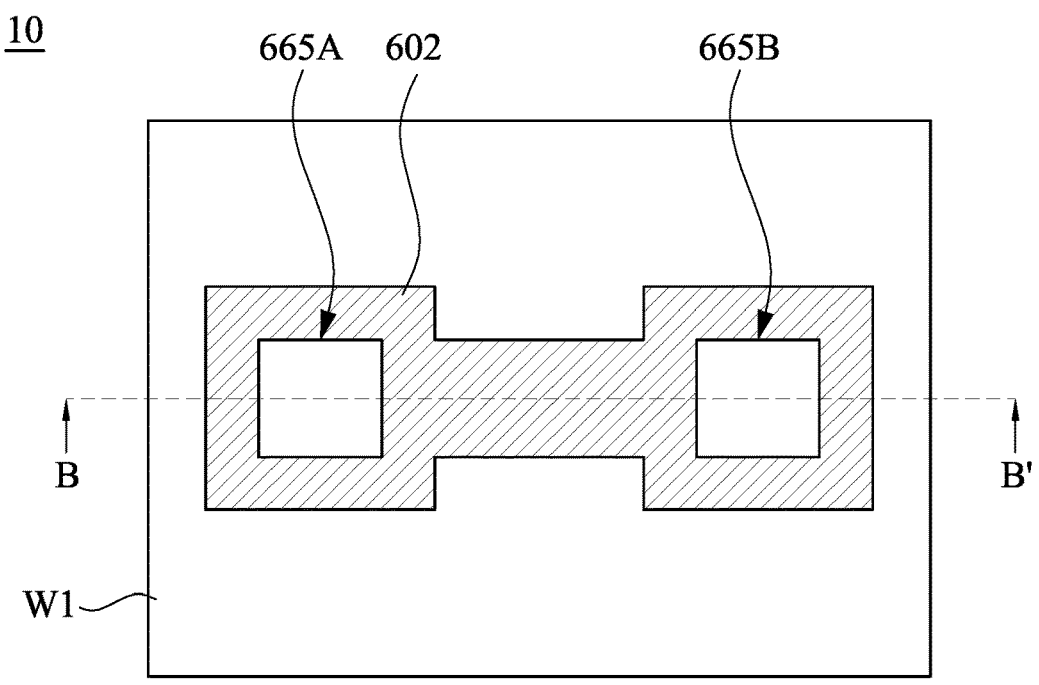
Figure 13B:
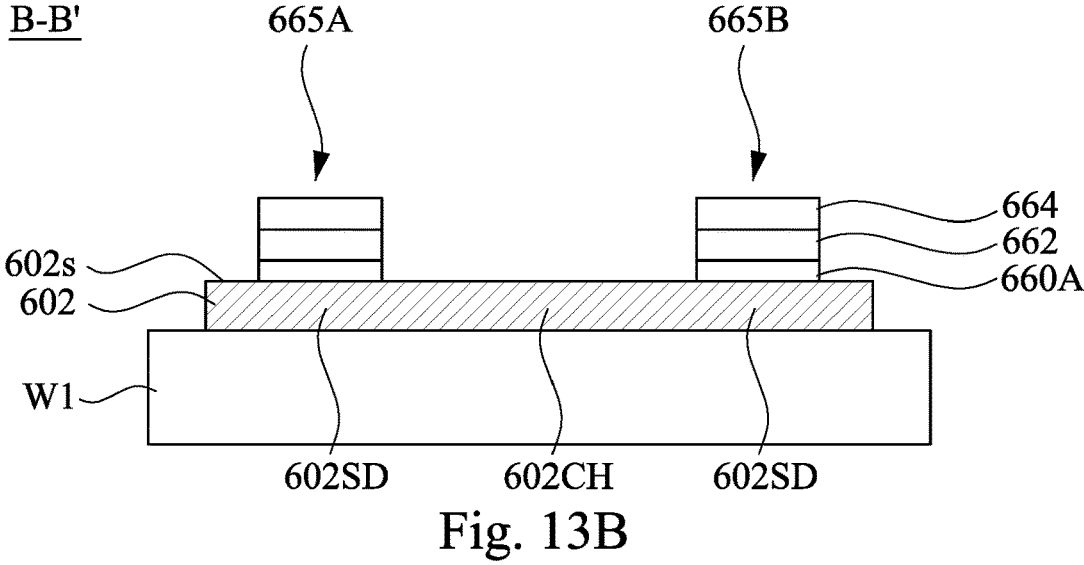

Reference is made to FIGS. 13A and 13B. FIG. 13A illustrates a top view of an intermediate structure of the wafer W1 with the TMD layer 602 in an IC manufacturing process in accordance with some embodiments of the present disclosure. FIG. 13B is a cross-sectional view along line B-B′ of FIG. 13A. As shown in FIGS. 13A and 13B, the mask layer 650 is removed, leaving the first portion 660A of the contact layer 660, the separation metal layer 662 and the electrode metal layer 664 over the top surface 602s of the TMD layer 602. In greater detail, the second portion 660B of the contact layer 660 and the overlying separation metal and electrode metal are removed together with the mask layer 650. After the mask layer 650 is removed, a first source/drain contact 665A and a second source/drain contact 665B are formed. In some embodiments, each of the first source/drain contact 665A and the second source/drain contact 665B includes the first portion 660A of the contact layer 660, the separation metal layer 662 and the electrode metal layer 664. The first portion 660A of the contact layer 660 of the first and second source/drain contacts 665A/665B is in direct contact with the TMD layer 602. In some embodiments, the contact resistance between the first portion 660A of the contact layer 660 and the TMD layer 602 is lower than that between a metal and TMD layer 602.

In some embodiments, the process shown in FIGS. 12A to 13B can be referred to as a lift-off process. For example, the wafer W1 is immersed into a tank of appropriate solvent that will react with the mask layer 650. The mask layer 650 swells, dissolves, and lifts off the second portion 660B of the contact layer 660, the separation metal layer 662 and the electrode metal layer 664 above the surface of the resist mask layer 650, leaving first portion 660A of the contact layer 660, the separation metal layer 662 and the electrode metal layer 664 to remain over the TMD layer 602. The resulting structure is shown in FIGS. 13A and 13B.

In some embodiments, because the patterns of the first portion 660A of the contact layer 660, the separation metal layer 662 and the electrode metal layer 664 are defined by the same mask layer 650, the respective edges (or sidewalls) of the first portion 660A of the contact layer 660, the separation metal layer 662 and the electrode metal layer 664 are substantially vertically aligned and are substantially co-terminus.

Any residual mask layer 650 may be optionally cleaned by another solvent or by appropriate plasma chemistry to control defect density. Examples of suitable solvents include xylene and methyl iso-butyl ketone. In some embodiments, this process be carded out in an ultrasonic bath with agitation to enhance the lift-off of undesirable metalization.

Figure 13C:
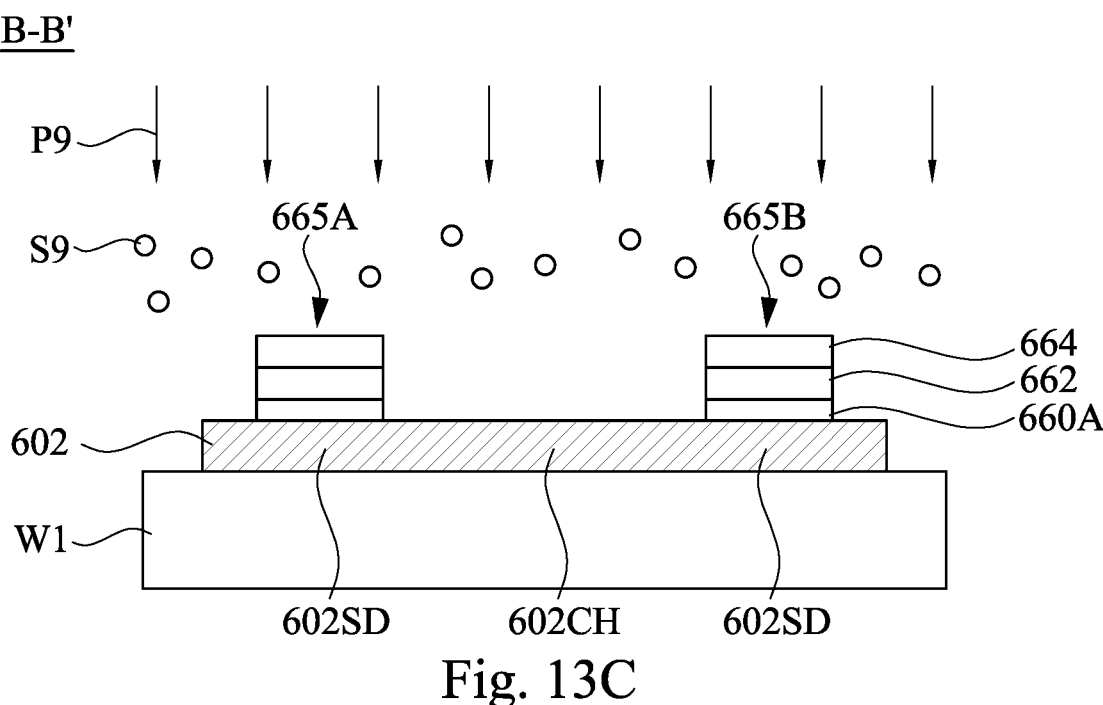
Figure 13D:
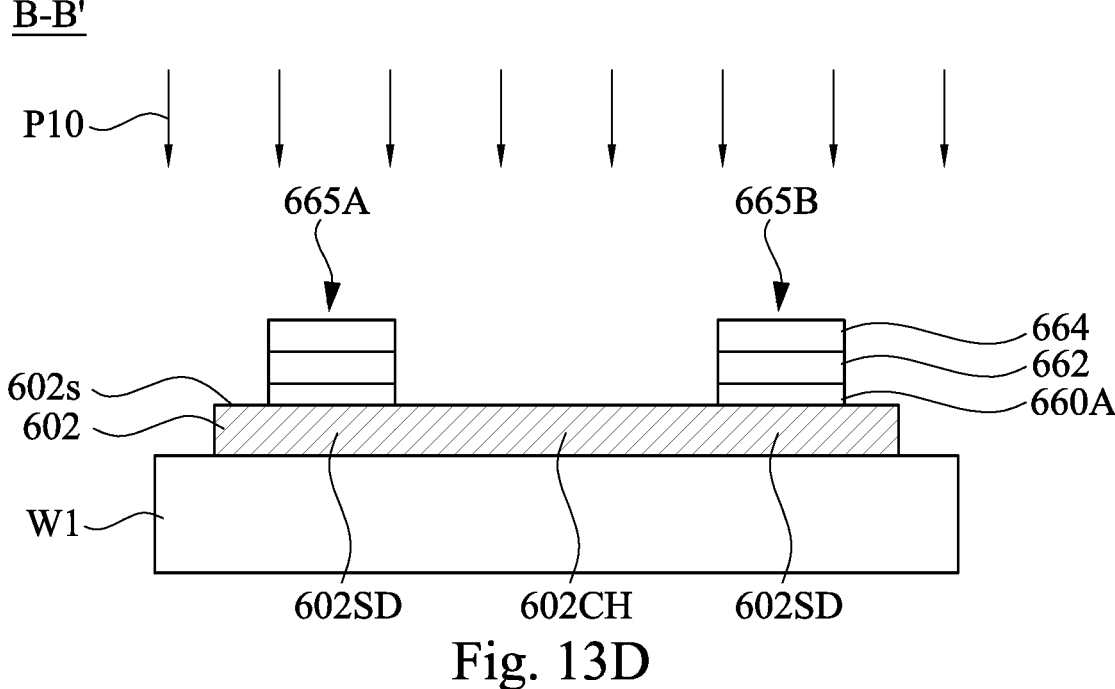

Reference is made to FIGS. 13C and 13D. After the mask layer 650 is removed, an IBA method includes an ion bombardment process P9 and an annealing process P10 can be performed on the channel region 602CH to decrease surface defects on the channel region 602CH. In some embodiments, the IBA method shown in FIGS. 13C and 13D is performed while at least one of the IBA methods shown in FIGS. 7, 8, 9C, 9D, 10C, and 10D is omitted. As shown in FIG. 13C, the ion bombardment process P9 is performed on the channel region 602CH. After the channel region

602CH is bombarded, the surface 602s of the channel region 602CH becomes rough with nanogranule and forms ion-bombarded damagements, such as holes, clusters, and/or other defects, thereof, and the surface crystallinity of the channel region 602CH can be attenuated. The ion-bombarded damagement can destroy the bonds around the crystalline defect and have a greater dimension than the crystalline defect. In some embodiments, after the ion bombardment process P9, the surface 602s of the channel region 602CH may be formed by amorphous crystals or polycrystals, or grain regions. In some embodiments, the ion bombardment process P9 can use an ion source S9 including inert gas having atomic weight less than about 50, such as He, Ne, Ar, in a plasma state. In some embodiments, the ion source S9 used in the ion bombardment process P9 may include positively (e.g. Ar$^+$) or negatively charged ions. In some embodiments, the ion bombardment process P9 can have an ion bombardment energy in a range from about 0.1 keV to about 2.0 keV, such as about 0.1, 0.5, 1, 1.5, or 2 keV. In some embodiments, the ion bombardment process P9 can have a process time duration in a range from about 1 to about 30 minutes, such as about 1, 3, 5, 10, 15, 20, 25, or 30 minutes. In some embodiments, the ion bombardment process P9 can be performed under a pressure lower than about $1 \times 10^{-5}$ Torr.

Reference is made to FIG. 13D. After the ion bombardment process P9, the annealing process P10 is performed on the channel region 602CH. The annealing process P10 initiates recrystallization or restoration of the long-range ordering on the channel region 602CH. The channel region 602CH with the ion-bombarded damagements can be healed by the annealing process P10. In this stage, some chalcogen atoms and transition metal atoms diffuse to recrystallize the surface 602s of the channel region 602CH. The outermost surface of the channel region 602CH can be first crystallized, which warrants no crystalline defect (e.g., chalcogen vacancy) at the surface 602s of the channel region 602CH when the whole sample is nearly recrystallized. If a few vacancies remained at the surface 602s of the channel region 602CH in this stage instead of turning into the ion-bombarded damagements, they would be hardly removed simply by the low temperature or even by further elevating the temperature. Subsequently, some vacancies could be buried underneath, and some atoms could remain atop the surface 602s as shown in FIG. 21. These vacancies could diffuse toward the interior of the channel region 602CH and/or the edge of the channel region 602CH, or be amended by migrating adatoms through a chain process.

After the annealing process P10 is complete, the surface 602s of the channel region 602CH can be perfectly restored, with nearly no surface defects, the density of surface defects can be less than about $1.0 \times 10^{10}$ cm$^{-2}$ (counts by areas>about 10000 nm$^2$), by way of example but not limiting the present disclosure. In some embodiments, the annealing process P10 can be performed at a temperature in a range from about 100° C. to about 600° C., such as about 100, 200, 300, 400, 500, or 600° C. In some embodiments, the temperature of the annealing process P10 can be ramped up or directly set to the recrystallization temperature. In some embodiments, the annealing process P10 is performed under a pressure lower than about $1 \times 10^{-5}$ Torr. In some embodiments, a precursor can be introduced on the channel region 602CH during the annealing process P10 to form a precursor-rich ambient around the channel region 602CH, and the precursor may include chalcogen element (e.g., Te, Se, or S) that is the same as chalcogen atom in the channel region 602CH.

In some embodiments, the ion bombardment process P9 and the annealing process P10 in the IBA method may be performed sequentially or simultaneously. In some embodiments, the ion bombardment process P9 and the annealing process P10 in the IBA method may be performed in-situ or ex-situ. In some embodiments, the IBA method can be a cyclic process including at least one repetition of an ion bombardment process and an annealing process. For example, it may perform an ion bombardment process P9 (e.g., FIG. 13C) followed by an annealing process P10 (e.g., FIG. 13D), and repeats the ion bombardment process P9 and the annealing process P10.

Figure 14A:
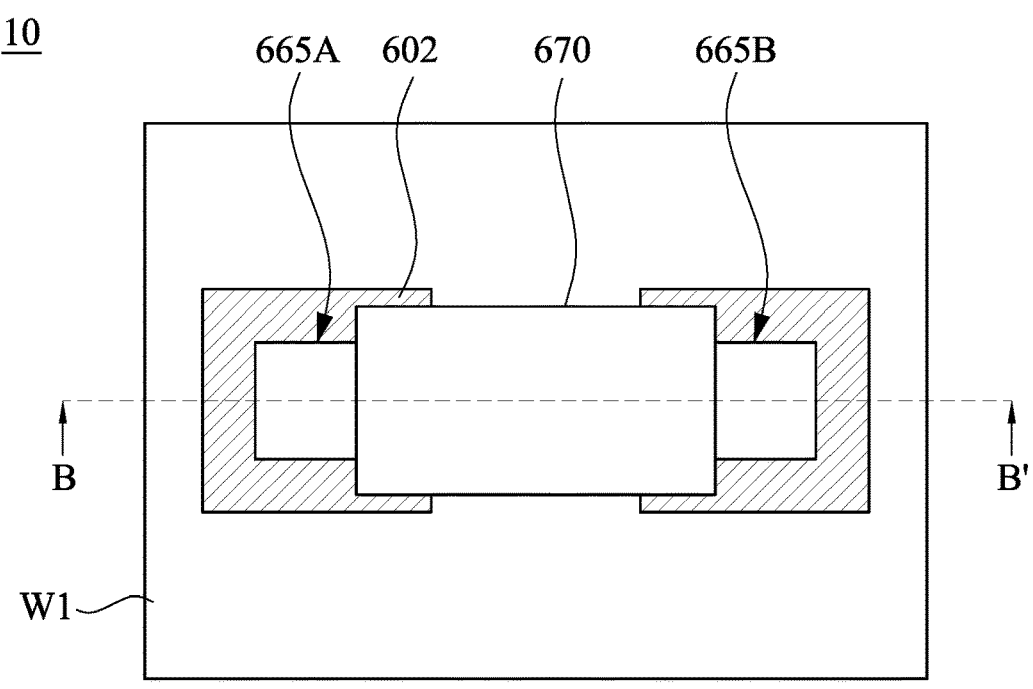
Figure 14B:
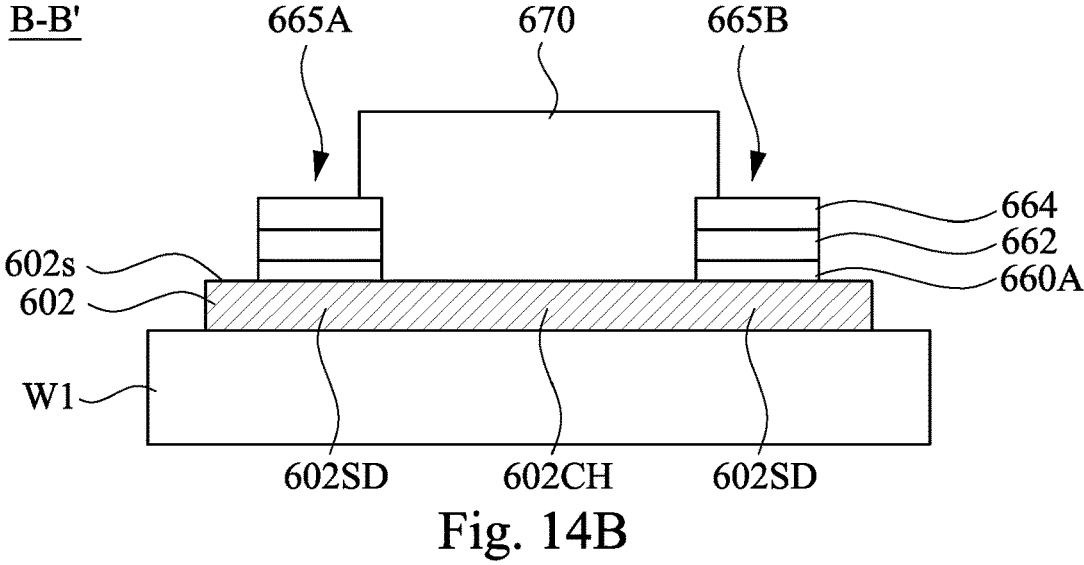

Reference is made to FIGS. 14A and 14B. FIG. 14A illustrates a top view of an intermediate structure of the wafer W1 with the TMD layer 602 in an IC manufacturing process in accordance with some embodiments of the present disclosure. FIG. 14B is a cross-sectional view along line B-B' of FIG. 14A. As shown in FIGS. 14A and 14B, a gate dielectric layer 670 is formed over the channel region 602CH of the TMD layer 602, the first source/drain contact 665A, and the second source/drain contact 665B. In some embodiments, the gate dielectric layer 670 extends along portions of the top surfaces of the first source/drain contact 665A and the second source/drain contact 665B, while leaving other portions of the top surfaces of the first source/drain contact 665A and the second source/drain contact 665B exposed. In some embodiments, the gate dielectric layer 670 extends along the sidewalls of the first source/drain contact 665A and the second source/drain contact 665B. In some embodiments, the gate dielectric layer 670 is extends along an entire surface of the TMD layer 602 between the first source/drain contact 665A and the second source/drain contact 665B.

The gate dielectric layer 670 can be formed by, for example, depositing a dielectric material layer blanket over the wafer W1, and followed by a patterning process to remove portions of the dielectric material layer. The resulting structure is shown in FIGS. 14A and 14B. The gate dielectric layer 670 includes silicon oxide, silicon oxynitride, a combination thereof, or another suitable material. In some embodiments, the gate dielectric layer 670 includes a high dielectric constant material (high-k material), in accordance with some embodiments. The high-k material includes metal oxides, metal nitrides, metal silicates, transition metal-oxides, transition metal-nitrides, transition metal-silicates, oxynitrides of metals, aluminum oxide, hafnium dioxide-alumina ($HfO_2$—$Al_2O_3$) alloy, another suitable material, or a combination thereof, in accordance with some embodiments. The high-k material includes hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), or a combination thereof, in accordance with some embodiments. The gate dielectric layer 670 is formed using a CVD process or another suitable process.

Figure 15A:
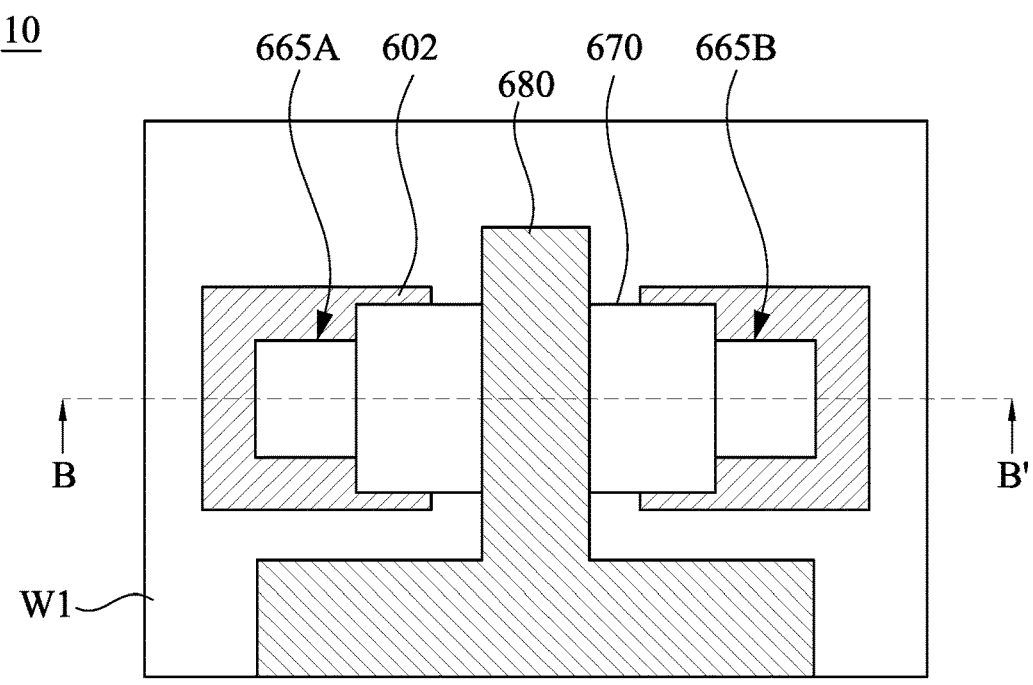
Figure 15B:
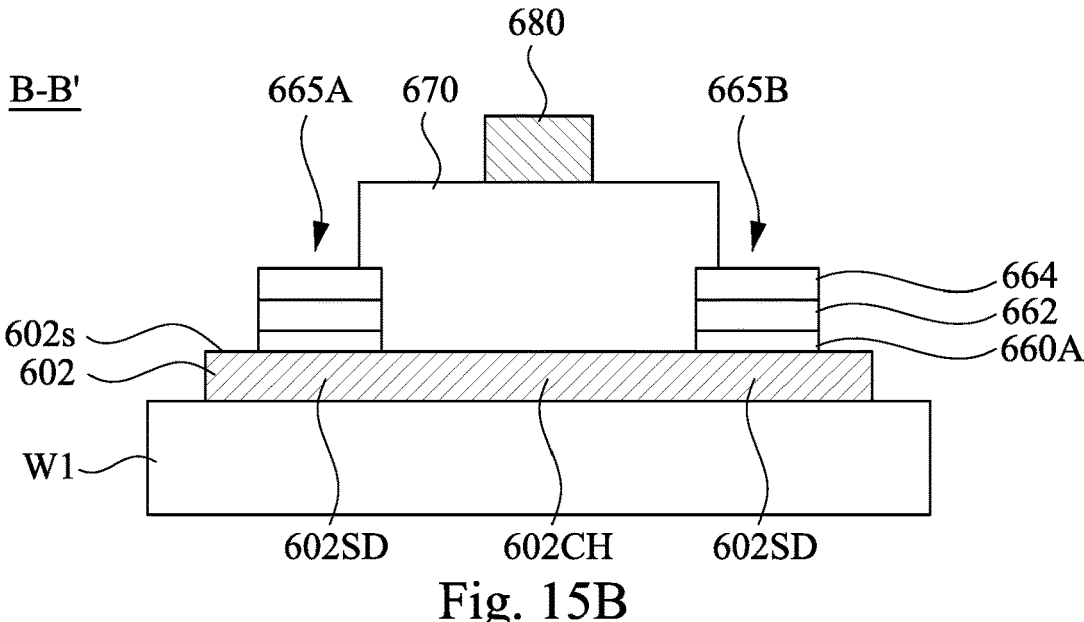

Reference is made to FIGS. 15A and 15B. FIG. 15A illustrates a top view of an intermediate structure of the wafer W1 with the TMD layer 602 in an IC manufacturing process in accordance with some embodiments of the present disclosure. FIG. 15B is a cross-sectional view along line B-B' of FIG. 15A. As shown in FIGS. 15A and 15B, a gate electrode 680 is formed over the gate dielectric layer 670. The gate electrode 680 can be formed of suitable electrically conductive material, including polysilicon, graphene, and metal including one or more layers of aluminum, copper, titanium, tantalum, tungsten, cobalt, molybdenum, nickel, manganese, silver, palladium, rhenium, iridium, ruthenium, platinum, zirconium, tantalum nitride, nickel silicide, cobalt silicide, TiN, WN, TiAl, TiAlN, TaCN, TaC, TaSiN, metal alloys, other suitable materials, and/or combinations thereof. The gate electrode 680 may be formed by one or more deposition processes, such as CVD, ALD. PVD (sputtering), electroplating, and/or other suitable method, followed by one or more etching process to pattern the deposited materials of gate electrode 680.

Therefore, based on the above discussions, it can be seen that the present disclosure offers advantages. It is understood, however, that other embodiments may offer additional advantages, and not all advantages are necessarily disclosed herein, and that no particular advantage is required for all embodiments. The present disclosure in various embodiments provides a method to decrease surface defects on layered TMDs: a two-step process including an ion bombardment process and a subsequent annealing process. The ion bombardment process can produce ion-bombarded damagements destroying the bonds around the intrinsic surface defects of the layered TMDs, and the annealing process can facilitate recrystallization of damaged surfaces. This two-step process can be interchangeably referred to as an IBA method. In greater detail, the ion-bombarded damagements can be recrystallized at a low temperature (e.g., lower than about 600° C.), such that the surface of the TMD layer can be restored at the low temperature accordingly. With this approach, the defects, such as chalcogen vacancies, on the surfaces of the layered TMDs can be decreased. On the other hands, if the intrinsic surface defects are remained at the surface of the layered TMDs, they would be hardly removed simply by the low temperature or even by further elevating the temperature. In some embodiments, a method includes forming a TMD layer on a first substrate; performing an ion bombardment process on the TMD layer; performing an annealing process on the TMD layer. In some embodiments, the annealing process is performed after the ion bombardment process. In some embodiments, the ion bombardment process and the annealing process are performed simultaneously. In some embodiments, the method further includes after performing the ion bombardment process and the annealing process, transferring the TMD layer from the first substrate onto a second substrate. In some embodiments, the method further includes before performing the ion bombardment process and the annealing process, transferring the TMD layer from the first substrate onto a second substrate. In some embodiments, the method further includes introducing a chalcogen-containing precursor on the TMD layer during the annealing process. In some embodiments, the ion bombardment process is performed by using an inert gas as a bombardment source. In some embodiments, the ion bombardment process has an ion bombardment energy in a range from about 0.1 keV to about 2.0 keV. In some embodiments, the annealing process is performed at a temperature lower than about 600° C. In some embodiments, the annealing process is performed under a pressure lower than about $1\times10^{-5}$ Torr.

In some embodiments, a method includes forming a TMD on a substrate; bombarding the TMD using Ar plasma; after bombarding the TMD, annealing the TMD; introducing a precursor on the TMD, the precursor having a same chalcogen element as the TMD. In some embodiments, the TMD is made of platinum ditelluride, palladium ditelluride, or combinations thereof. In some embodiments, the chalcogen element comprises tellurium, selenium, sulfur, or combinations thereof. In some embodiments, the method further includes the substrate is made of graphene. In some embodiments, the method further includes bombarding the TMD is performed in a time duration in a range from about 1 minutes to about 5 minutes.

In some embodiments, a method includes forming a TMD layer on a substrate; transferring the TMD layer from the substrate onto a wafer, the wafer having a transistor and an interconnect structure over the transistor; after transferring the TMD layer, performing a first ion bombardment process on the TMD layer; after performing the first ion bombardment process, performing a first annealing process on the TMD layer; patterning the TMD layer to form a device element. In some embodiments, the TMD layer has a transition metal element comprising platinum, palladium, or combinations thereof. In some embodiments, the first annealing process is performed at a temperature in a range from about 100° C. to about 600° C. In some embodiments, performing a second ion bombardment process on the TMD layer. In some embodiments, after performing the second ion bombardment process, performing a second annealing process on the TMD layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
   forming a transition metal dichalcogenide (TMD) layer on a first substrate;
   forming a source/drain contact over the TMD layer;
   after forming the source/drain contact, performing an ion bombardment process through the source/drain contact to the underlying TMD layer; and
   performing an annealing process on the TMD layer.

2. The method of claim 1, wherein the annealing process is performed after the ion bombardment process.

3. The method of claim 1, wherein the ion bombardment process and the annealing process are performed simultaneously.

4. The method of claim 1, further comprising:
   after performing the ion bombardment process and the annealing process, transferring the TMD layer from the first substrate onto a second substrate.

5. The method of claim 1, further comprising:
   before performing the ion bombardment process and the annealing process, transferring the TMD layer from the first substrate onto a second substrate.

6. The method of claim 1, further comprising:
   introducing a chalcogen-containing precursor on the TMD layer during the annealing process.

7. The method of claim 1, wherein the ion bombardment process is performed by using an inert gas as a bombardment source.

8. The method of claim 1, wherein the ion bombardment process has an ion bombardment energy in a range from about 0.1 keV to about 2.0 keV.

9. The method of claim 1, wherein the annealing process is performed at a temperature lower than about 600° C.

10. The method of claim 1, wherein the annealing process is performed under a pressure lower than about $1\times10^{-5}$ Torr.

11. A method, comprising:
    forming a TMD on a substrate;
    forming a source/drain contact over the TMD;
    after forming the source/drain contact, bombarding the TMD using Ar plasma;
    after bombarding the TMD, annealing the TMD; and
    introducing a precursor on the TMD, the precursor having a same chalcogen element as the TMD.

12. The method of claim 11, wherein the TMD is made of platinum ditelluride, palladium ditelluride, or combinations thereof.

13. The method of claim 11, wherein the chalcogen element comprises tellurium, selenium, sulfur, or combinations thereof.

14. The method of claim 11, wherein the substrate is made of graphene.

15. The method of claim 11, wherein bombarding the TMD is performed in a time duration in a range from about 1 minutes to about 5 minutes.

16. A method, comprising:
    forming a TMD layer on a substrate;
    transferring the TMD layer from the substrate onto a wafer, the wafer having a transistor and an interconnect structure over the transistor;
    patterning the TMD layer to form a channel region and source/drain regions on opposite sides of the channel region;
    after patterning the TMD layer, forming a metal layer, as a mask, over the source/drain regions of the TMD layer while exposing the channel region of the TMD layer;
    performing a first ion bombardment process on the exposed channel region of the TMD layer while the source/drain regions remain covered by the metal layer;
    after performing the first ion bombardment process, performing a first annealing process on the TMD layer; and
    patterning the TMD layer to form a device element.

17. The method of claim 16, wherein the TMD layer has a transition metal element comprising platinum, palladium, or combinations thereof.

18. The method of claim 16, wherein the first annealing process is performed at a temperature in a range from about 100° C. to about 600° C.

19. The method of claim 16, further comprising:
    performing a second ion bombardment process on the TMD layer.

20. The method of claim 19, further comprising:
    after performing the second ion bombardment process, performing a second annealing process on the TMD layer.

* * * * *